(12) United States Patent
Okada et al.

(10) Patent No.: US 6,233,213 B1
(45) Date of Patent: May 15, 2001

(54) METHOD OF CONVERTING BITS OF OPTICAL DISK, DEMODULATING METHOD AND APPARATUS

(75) Inventors: Takenori Okada, Yamato; Keisuke Tanaka, Kawasaki; Teruhiko Ushio, Moriyama, all of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/197,484

(22) Filed: Nov. 20, 1998

(30) Foreign Application Priority Data

Nov. 26, 1997 (JP) .................................................. 9-324569

(51) Int. Cl.$^7$ ...................................................... G11B 7/00
(52) U.S. Cl. .............................................................. 369/59
(58) Field of Search ................................. 369/59, 54, 58, 369/47, 48, 275.3

(56) References Cited

U.S. PATENT DOCUMENTS

| | | | |
|---|---|---|---|
| 4,928,187 | 5/1990 | Rees | 360/40 |
| 5,535,187 | 7/1996 | Melas et al. | 369/59 |
| 5,535,287 | * 7/1996 | Melas et al. | 369/59 |
| 5,587,981 | 12/1996 | Kamatani | 369/58 |

\* cited by examiner

Primary Examiner—Nabil Hindi
(74) Attorney, Agent, or Firm—G. Marlin Knight; Ron Feece

(57) ABSTRACT

A method and apparatus are described which demodulate channel bits modulated by an arbitrary one of two modulation schemes, by making use of a consolidated reference table with a small address space. The method of the invention comprises the steps of: generating first output bits for representing patterns that correspond to patterns represented by first channel bits other than those patterns being unable to exist under first RLL constraints, the first output bits having a lesser number of bits than the first channel bits; and generating second output bits for representing patterns that correspond to patterns represented by second channel bits other than those patterns being unable to exist under second RLL constraints, the patterns represented by the second output bits being located at discontinuous areas of the patterns represented by the first output bits, the second output bits having a lesser number of bits than the second channel bits. The first and second output bits are used for designating an address of a demodulating reference table.

9 Claims, 16 Drawing Sheets

Figure 2

Part of Conversion Table for EFM Modulation

| Decimal Number | Data Code | Codeword |
|---|---|---|
| 100 | 01100100 | 01000100100010 |
| 101 | 01100101 | 00000000100010 |
| 102 | 01100110 | 01000000100100 |
| 103 | 01100111 | 00100100100010 |
| 104 | 01101000 | 01001001000010 |
| 105 | 01101001 | 10000001000010 |
| 106 | 01101010 | 10010001000010 |
| 107 | 01101011 | 10001001000010 |
| 108 | 01101100 | 01000001000010 |
| 109 | 01101101 | 00000001000010 |
| 110 | 01101110 | 00010001000010 |
| 111 | 01101111 | 00100001000010 |
| 112 | 01110000 | 10000000100010 |
| 113 | 01110001 | 10000010000010 |
| 114 | 01110010 | 10010010000010 |
| 115 | 01110011 | 00100000100010 |
| 116 | 01110100 | 01000010000010 |
| 117 | 01110101 | 00000010000010 |
| 118 | 01110110 | 00010010000010 |
| 119 | 01110111 | 00100010000010 |
| 120 | 01111000 | 01001000000010 |

Figure 3

Part of Main Conversion Table for 8/16 Modulation

| Data Code (Decimal) | STATE1 Codeword | STATE1 NEXT STATE | STATE2 Codeword | STATE2 NEXT STATE | STATE3 Codeword | STATE3 NEXT STATE | STATE4 Codeword | STATE4 NEXT STATE |
|---|---|---|---|---|---|---|---|---|
| 0 | 0010000000001001 | 1 | 0100000100100000 | 2 | 0010000000001001 | 1 | 0100000100100000 | 2 |
| 1 | 0010000000010010 | 1 | 0010000000010010 | 1 | 1000000100100000 | 3 | 1000000100100000 | 3 |
| 2 | 0010000100100000 | 2 | 0010000100100000 | 2 | 1000000000010010 | 1 | 1000000000010010 | 1 |
| 3 | 0010000010010000 | 2 | 0100000100010000 | 4 | 0010000000010010 | 2 | 0100000100010000 | 4 |
| 4 | 0010000100010000 | 2 | 0010000100010000 | 2 | 1000000100100000 | 2 | 1000000100100000 | 2 |
| 5 | 0010000000100100 | 2 | 0010000000100100 | 2 | 1001001000000000 | 4 | 1001001000000000 | 4 |
| 6 | 0010000000100100 | 3 | 0010000000100100 | 3 | 1000100100000000 | 4 | 1000100100000000 | 4 |
| 7 | 0010000001001000 | 3 | 0100000001001000 | 3 | 0010000001001000 | 3 | 0100000001001000 | 1 |
| 8 | 0010000010010000 | 3 | 0010000010010000 | 3 | 1000010010000000 | 4 | 1000010010000000 | 4 |
| 9 | 0010000100100000 | 3 | 0010000100100000 | 3 | 1001001000000001 | 1 | 1001001000000001 | 1 |
| 10 | 0010010000000000 | 4 | 0010010000000000 | 4 | 1000100100000001 | 1 | 1000100100000001 | 1 |

|  | Octal Notation | 03 | 04 | 06 | 0C | 0D | 13 | 14 | 16 | 19 | 1C |
|---|---|---|---|---|---|---|---|---|---|---|---|
| 8 Bits | B8(7) | 1 | 1 | 1 | 0 | 0 | 0 | 0 | 0 | 0 | 0 |
|  | B8(6) | 0 | 0 | 0 | 1 | 1 | 0 | 0 | 0 | 0 | 0 |
|  | B8(5) | 0 | 0 | 0 | 0 | 0 | 0 | 0 | 0 | 1 | 1 |
|  | B8(4) | 0 | 0 | 1 | 0 | 0 | 0 | 0 | 1 | 0 | 0 |
|  | B8(3) | 0 | 1 | 0 | 0 | 1 | 0 | 1 | 0 | 0 | 0 |
|  | B8(2) | 1 | 0 | 0 | 1 | 0 | 1 | 0 | 0 | 0 | 1 |
|  | B8(1) | 0 | 0 | 0 | 0 | 0 | 0 | 0 | 0 | 0 | 0 |
|  | B8(0) | 0 | 0 | 0 | 0 | 0 | 0 | 0 | 0 | 0 | 0 |
| 5 Bits | B5(4) | 0 | 0 | 0 | 0 | 0 | 1 | 1 | 1 | 1 | 1 |
|  | B5(3) | 0 | 0 | 0 | 1 | 1 | 0 | 0 | 0 | 1 | 1 |
|  | B5(2) | 0 | 1 | 1 | 1 | 1 | 0 | 1 | 1 | 0 | 1 |
|  | B5(1) | 1 | 0 | 1 | 0 | 0 | 1 | 0 | 1 | 0 | 0 |
|  | B5(0) | 1 | 0 | 0 | 0 | 1 | 1 | 0 | 0 | 1 | 0 |
| 4 Bits | B4(3) | 0 | 0 | 0 | 0 | 0 | 1 | 1 | 1 | 1 | 1 |
|  | B4(2) | 0 | 0 | 0 | 1 | 1 | 0 | 0 | 0 | 1 | 1 |
|  | B4(1) | 1 | 0 | 1 | 0 | 0 | 1 | 0 | 1 | 0 | 0 |
|  | B4(0) | 1 | 0 | 0 | 0 | 1 | 1 | 0 | 0 | 1 | 0 |

Figure 13

| Channel Bits | | Operational Process | | | | | | Address Bits | |
|---|---|---|---|---|---|---|---|---|---|
| Upper 8 Bits | Lower 6 Bits | NEXT | UpperB5 | | U-B2 | L-B2 | Pattern | | Decimal |
| Decimal | | | | | | | | | |

| Decimal | Upper 8 Bits | Lower 6 Bits | NEXT | UpperB5 | U-B2 | L-B2 | Pattern | Decimal |
|---|---|---|---|---|---|---|---|---|
| 25 | 1 0 0 0 0 0 0 0 | 0 0 1 1 0 0 | 0 | 0 0 0 0 0 | 1 | 0 | 0 0 0 0 0 0 0 1 1 1 1 | 15 |
| 217 | 1 1 0 0 0 0 0 0 | 1 1 0 1 0 0 | 0 | 0 0 0 0 0 | 1 | 1 | 0 0 0 0 0 1 1 1 0 1 | 29 |
| 249 | 1 1 0 0 0 0 0 0 | 1 1 1 0 0 1 | 0 | 0 0 0 0 0 | 1 | 0 | 0 0 0 0 0 1 1 1 1 0 | 30 |
| 153 | 1 0 0 0 0 0 0 0 | 1 1 0 0 1 0 | 0 | 0 0 0 0 0 | 1 | 1 | 0 0 0 0 1 0 0 1 1 1 | 79 |
| 209 | 1 1 0 0 0 0 0 0 | 1 0 0 1 0 0 | 0 | 0 0 0 0 0 | 1 | 0 | 0 0 0 0 1 0 1 1 1 1 | 93 |
| 241 | 1 1 0 0 0 0 0 0 | 1 1 1 0 0 1 | 0 | 0 1 0 0 0 | 1 | 1 | 0 0 0 0 1 0 1 1 1 0 | 94 |
| 51 | 0 0 0 0 0 0 0 0 | 1 1 0 0 1 1 | 0 | 0 1 0 0 0 | 1 | 0 | 0 0 0 0 1 1 0 1 1 1 | 111 |
| 193 | 1 1 0 0 0 0 0 0 | 0 0 0 1 0 1 | 0 | 0 1 0 0 0 | 1 | 1 | 0 0 0 0 1 1 1 1 0 1 | 125 |
| 226 | 1 1 1 0 0 0 1 0 | 0 0 0 0 1 0 | 0 | 0 1 0 1 1 | 1 | 0 | 0 0 0 0 1 1 1 1 1 0 | 126 |
| 27 | 0 0 0 0 0 0 0 0 | 0 1 1 1 1 1 | 0 | 0 1 0 1 1 | 1 | 1 | 0 0 0 0 1 1 1 1 1 1 | 143 |
| 183 | 1 0 1 1 0 1 1 1 | 1 0 0 0 0 0 | 1 | 1 0 1 1 1 | 1 | 0 | 1 0 1 1 1 1 0 1 1 1 | 1471 |
| 135 | 1 0 0 0 0 1 1 1 | 0 0 0 0 0 1 | 1 | 1 0 1 1 1 | 1 | 0 | 1 0 1 1 1 1 1 0 0 1 | 1473 |
| 35 | 0 0 1 0 0 0 1 1 | 0 0 0 0 1 0 | 1 | 1 1 1 1 1 | 1 | 0 | 1 0 1 1 1 1 0 1 1 0 | 1478 |
| 103 | 0 0 1 1 0 1 1 1 | 0 0 0 0 1 1 | 1 | 1 1 1 1 1 | 1 | 0 | 1 0 1 1 1 1 1 1 1 1 | 1479 |
| 71 | 0 0 1 0 0 1 1 1 | 0 0 0 1 0 0 | 1 | 1 1 1 1 0 | 0 | 0 | 1 0 1 1 1 1 1 0 0 1 | 1481 |
| 39 | 0 0 1 0 0 1 1 1 | 0 0 0 1 0 1 | 1 | 1 1 1 1 0 | 0 | 1 | 1 0 1 1 1 1 1 1 1 0 | 1486 |
| 167 | 1 0 1 0 0 1 1 1 | 0 0 0 1 1 0 | 1 | 1 1 1 0 0 | 0 | 1 | 1 0 1 1 1 1 0 1 1 1 | 1487 |
| S0 | 0 0 1 0 0 0 0 0 | 0 0 0 0 1 0 | 0 | 1 1 0 0 1 | 0 | 1 | 0 1 1 1 0 1 1 0 0 1 | 953 |
| S1 | 0 0 0 0 0 0 0 0 | 0 0 1 0 0 1 | 0 | 0 0 0 0 1 | 0 | 0 | 0 1 0 0 0 0 1 1 1 0 | 542 |

Figure 14

| Address Bits | Data Bits | Assignment | Address Bits | Data Bits | Assignment |
|---|---|---|---|---|---|
| 0 | 242 | DVD | 1461 | 198 | DVD |
| 1 | 179 | DVD | 1464 | 125 | DVD |
| 2 | 109 | DVD | 1466 | 66 | DVD |
| 3 | 79 | DVD | 1467 | 197 | DVD |
| 4 | 83 | DVD | 1468 | 196 | DVD |
| 5 | 55 | DVD | 1469 | 23 | DVD |
| 6 | 11 | DVD | 1470 | 55 | CD |
| 7 | 21 | DVD | 1471 | 183 | CD |
| 8 | 54 | DVD | 1472 | 193 | DVD |
| 9 | 151 | DVD | 1473 | 135 | CD |
| 10 | 110 | DVD | 1474 | 85 | DVD |
| 11 | 56 | DVD | 1475 | 123 | DVD |
| 12 | 73 | DVD | 1476 | 194 | DVD |
| 13 | 24 | DVD | 1477 | 78 | DVD |
| 14 | 22 | DVD | 1478 | 35 | CD |
| 15 | 25 | CD | 1479 | 103 | CD |
| 23 | 27 | DVD | 1480 | 195 | DVD |
| 24 | 2 | DVD | 1481 | 71 | CD |
| 25 | 149 | DVD | 1482 | 124 | DVD |
| 26 | 58 | DVD | 1483 | 83 | DVD |
| 27 | 26 | DVD | 1484 | 84 | DVD |
| 28 | 36 | DVD | 1485 | 65 | DVD |
| 29 | 217 | CD | 1486 | 39 | CD |
| 30 | 249 | CD | 1487 | 167 | CD |

METHOD OF CONVERTING BITS OF OPTICAL DISK, DEMODULATING METHOD AND APPARATUS

BACKGROUND OF THE INVENTION

1. Field of the Invention

This invention relates to a technique for converting a number of bits of digitally modulated channel bits and demodulating the same. More particularly, it relates to a technique for converting a number of bits of channel bits and demodulating the same in such a manner that signals from an optical disk may be commonly processed whether it is the DVD (Digital Video Disk) or the CD (Compact Disk).

2. Description of Related Art

As information distribution media employing the optical digital recording, there are CD and DVD. Different types of CDS include CD-ROM for read-only, CD-DA for audio, CD-WO for write-once and CD-R for recordable, all of which constitute the CD family by virtue of the uniformly defined recording/regenerating formats. Similarly, different types of DVDs constitute the DVD family.

Data bits of information to be recorded on CD or DVD are modulated into channel bits by its unique modulation scheme that complies with its unique RLL constraints, whereas a respective demodulating reference table is referred to for demodulating the original data bits during its playback. With regard to modulation of data bits, a notation "RLL (d, k)" represents that the number of successive 'ZEROS' occurring between 'ONES' in channel bits may be within the range of at least "d" (minimum run-length) and at most "k" (maximum run-length). Further, NRZ (NonReturn-to-Zero) or NRZI (NonReturn-to-Zero Inverted) recording method is employed to record data in such a way that a polarity of a bit 'ONE' is inverted at its leading edge or center portion only to represent presence/absence of a pit on an optical disk, while such an inversion is not done for a bit 'ZERO'. As a result, a modulation scheme that complies with its associated RLL constraints limits the minimum and maximum numbers of successive absences of pits on an optical disk. In so doing, during regeneration of information, it is possible to extract bit clock components for controlling a servo subsystem in a stable manner, and yet it is possible to obtain better regeneration characteristics that are free from wave interference due to a diffraction limit.

The EFM (Eight-to-Fourteen Modulation) modulation scheme has been employed for CD, whereas the 8/16 (alternatively called "EFMPlus") modulation scheme has been employed for DVD. One symbol of data bits is 8 bits for both of EFM and 8/16 modulation schemes, whereas one symbol of channel bits is 14 bits long for EFM modulation scheme and 16 bits long for 8/16 modulation scheme respectively. Note here that the term "symbol" means a word unit for error correction. Since both of CD and DVD employ different modulation schemes respectively, when one wishes to play back both of CD and DVD by means of a single playback apparatus, it has been required to provide signal processing circuitry (which is responsible for a sequence of operations, from detection of a sync bit pattern in a channel bit stream that enters into the demodulation subsystem up to output of regenerated data bits) for each of the modulation schemes respectively, in addition to provision of individual demodulating reference tables. FIG. 1 is a schematic block diagram showing a conventional optical disk playback apparatus that is capable of playing back both of CD and DVD.

As seen in FIG. 1, information on a medium 10 (CD or DVD) read by an optical head 11 is sent to a DVD data processor 16 and a CD-DA processor 17 via an RF preamplifier 12 as RF analog signals of a channel bit stream. However, data processor 16 or 17 operates to play back its associated medium alone. That is, data processor 16 including an 8/16 demodulator is only used during a DVD playback, whereas data processor 17 including an EFM demodulator is only used during a CD playback. After performing predetermined processing, its resultant data is sent to an interface 18 or a CD audio amplifier 19. Both of the 8/16 and EFM demodulators are provided with memories for storing demodulating reference tables, which are uniquely associated therewith respectively.

When channel bits of 16 bits long are treated as directly indicating an address of a ROM in the 8/16 demodulator for storing its demodulating reference table, the memory requires a space of 65,536 addresses. On the other hand, the demodulating reference table in the EFM demodulator requires a space of 16,384 addresses in its ROM since its associated channel bits are 14 bits long.

SUMMARY OF THE INVENTION

In said playback apparatus, both of CD and DVD are not concurrently played back. This means that while one of the media is being played back, a data processor associated with the other media is not being operated, which leads to a reduction in availability of its signal processing circuitry. Also, each of the demodulating reference tables separately requires a certain amount of memory capacity respectively, which leads to heavy consumption of memory resources.

It is, therefore, an object of this invention to provide a technique for converting numbers of bits of channel bits modulated by first and second modulation schemes into lesser numbers of bits in such a manner that regenerated signals may be commonly processed by a single processing path.

It is another object of this invention to provide a demodulating reference table, which is formed by consolidating respective reference tables used for demodulating channel bits modulated by first and second modulation schemes, and which is storable in a small capacity memory.

It is another object of this invention to provide a technique for demodulating channel bits that makes use of said converting technique and said demodulating reference table. It is another object of this invention to provide an optical disk playback apparatus characterized by demodulating circuitry for regenerated signals.

Numbers of bits of channel bits to/from CD and DVD are determined by RLL constraints so as to improve recording/playback characteristics of a medium. Note that among those patterns representable by a predetermined number of channel bits, some patterns may not actually exist under the RLL constraints. When channel bits are picked up from an optical disk and introduced into a regeneration subsystem, a number of bits for representing respective patterns of channel bits may be reduced by associating the patterns with other patterns represented by other bits having a lesser number of bits than the channel bits. A fundamental principle of this invention resides in generating signals for use in a playback by converting a number of bits of channel bits modulated by a first or second modulation scheme. Also, another principle of this invention resides in creating a consolidated reference table for use in demodulating patterns of first or second channel bits, thereby enabling to store it into a memory of a smaller address space.

In one aspect of this invention, there is provided a method and an apparatus for converting first or second channel bits, modulated by a first or second modulation scheme, to first or second output bits respectively. While the output bits may be used as address bits for referring to an address of a memory that stores a demodulating reference table, they may be used in a signal processing subsystem as well for processing signals detected from an optical disk. In the bit conversion of this invention, respective patterns actually represented by the channel bits before-conversion are associated with those patterns that are representable by the output bits after-conversion, which have a lesser number of bits than the channel bits. Respective output bits are generated in such a way that they represent patterns, which correspond to patterns represented by the channel bits other than those patterns being unable to exist under RLL constraints. Further, patterns of the second output bits are generated in such a way that they are assigned to discontinuous areas of patterns represented by the first output bits. In so doing, it becomes possible to reduce a number of bits of respective output bits than that of respective channel bits, which in turn enables to reduce a bus width for lessening a burden to the subsequent signal processing subsystem, and yet to unifies the signal processing subsystem. Further, the first and second output bits may be used for addressing the common reference table of a small address space.

In another aspect of this invention, said first modulation scheme is 8/16 modulation scheme, whereas said second modulation scheme is EFM modulation scheme. Both of these modulation schemes are being employed for optical disks of the DVD and CD families respectively, and they may be used in the signal processing subsystem for regenerating signals from both types of optical disks.

In yet another aspect of this invention, there is provided an apparatus for converting channel bits to output bits. While means for identifying channel bits, means for generating first output bits and means for generating second output bits may be implemented by one or more stored program processors, it is preferable to implement these means by one or more wired logic circuitry each comprising a combination of logic elements for causing bit operations to be directly performed. This is because bit processing for demodulation has to be continuously performed at high-speed.

In another aspect of this invention, there is provided a method of creating a reference table for demodulating patterns of first and second channel bits, modulated by first and second modulation schemes respectively. First and second address patterns correspond to patterns, which are representable by all of respective channel bits other than those patterns being unable to actually exist within the said respective channel bits. Accordingly, a number of bits for representing respective address patterns may be smaller than that of respective channel bits. Since the second address patterns are assigned to discontinuous areas of the first address patterns, it is possible to embed all of the second address patterns within the range of an address space that is defined by a number of bits for representing the first address patterns. Both of the address patterns are associated with patterns of respective data bits through corresponding patterns of respective channel bits.

In yet another aspect of this invention, there is provided a method and an apparatus for demodulating patterns of first and second channel bits, modulated by first and second modulation schemes respectively. Respective channel bits are converted to respective output bits, after identifying the said channel bits modulated by its associated modulation scheme. A demodulating reference table is created by associating the first and second address patterns with patterns of the data bits. Since the second address patterns are assigned to discontinuous areas of the first address patterns, there is no need to enlarge an address space even where an address pattern is referred to by bits. Referring to respective address patterns using patterns that are represented by respective output bits, it is possible to obtain patterns of the data bits via the output bits and the address patterns. In so doing, it is possible to consolidate respective reference tables associated with the first and second modulation schemes into a common reference table, thereby reducing an address space required for accommodating the same.

In another aspect of this invention, there is provided an optical disk playback apparatus having a demodulator of the type as set forth above. This demodulator employs a data bus that is narrower than a data bus required for channel bits, and it is capable of demodulating signals from at least two different optical disks by making use of a single reference table.

BRIEF DESCRIPTION OF THE DRAWINGS

FIG. 2 is a diagram showing a part of a conversion table for EFM modulation;

FIG. 3 is a diagram showing a part of a conversion table for 8/16 modulation;

FIG. 9 is a diagram showing an operational process for converting 8/16 modulated channel bits in the present embodiment;

FIG. 11 is a diagram showing an embodiment of 5-bit patterns and their compressed 4-bit patterns, which are obtained by applying bit operations I to lower 8 bits of codewords each representing '1' at its NEXT STATE column respectively;

FIG. 13 is a diagram showing an operational process for converting EFM modulated channel bits in the present embodiment;

FIG. 14 is a diagram showing a part of a demodulating reference table in the present embodiment;

DETAILED DESCRIPTION OF THE PREFERRED EMBODIMENTS

Firstly, the conventional modulation schemes for CD and DVD that form a basis of this invention will be described.

In EFM modulation scheme adopted for CD, 8 data bits (source) are encoded into 14 channel bits as one symbol. FIG. 2 shows a part of a conversion table for EFM modulation, which is created to contain selected codewords of better recording characteristics. In short, these codewords are accommodated in this table in association with possible 256 data codes, which are representable by 8 bits and selected from possible 16,384 code patterns of 14 bits. Data codes correspond to patterns of data bits, whereas codewords correspond to patterns of channel bits. Selection of the codewords complies with the RLL (2, 10) in such a manner that the number of 'ZEROS' inserted between 'ONES' in channel bits is kept within the range of at least '2' and at most '10'. Also, in order to satisfy the RLL (2, 10) even at a cascading section between neighboring groups of channel bits in a bit stream and yet to reduce DC-components or low-frequency components of the frequency spectrum of modulated signals, 3 margin bits are inserted.

Figure 1:
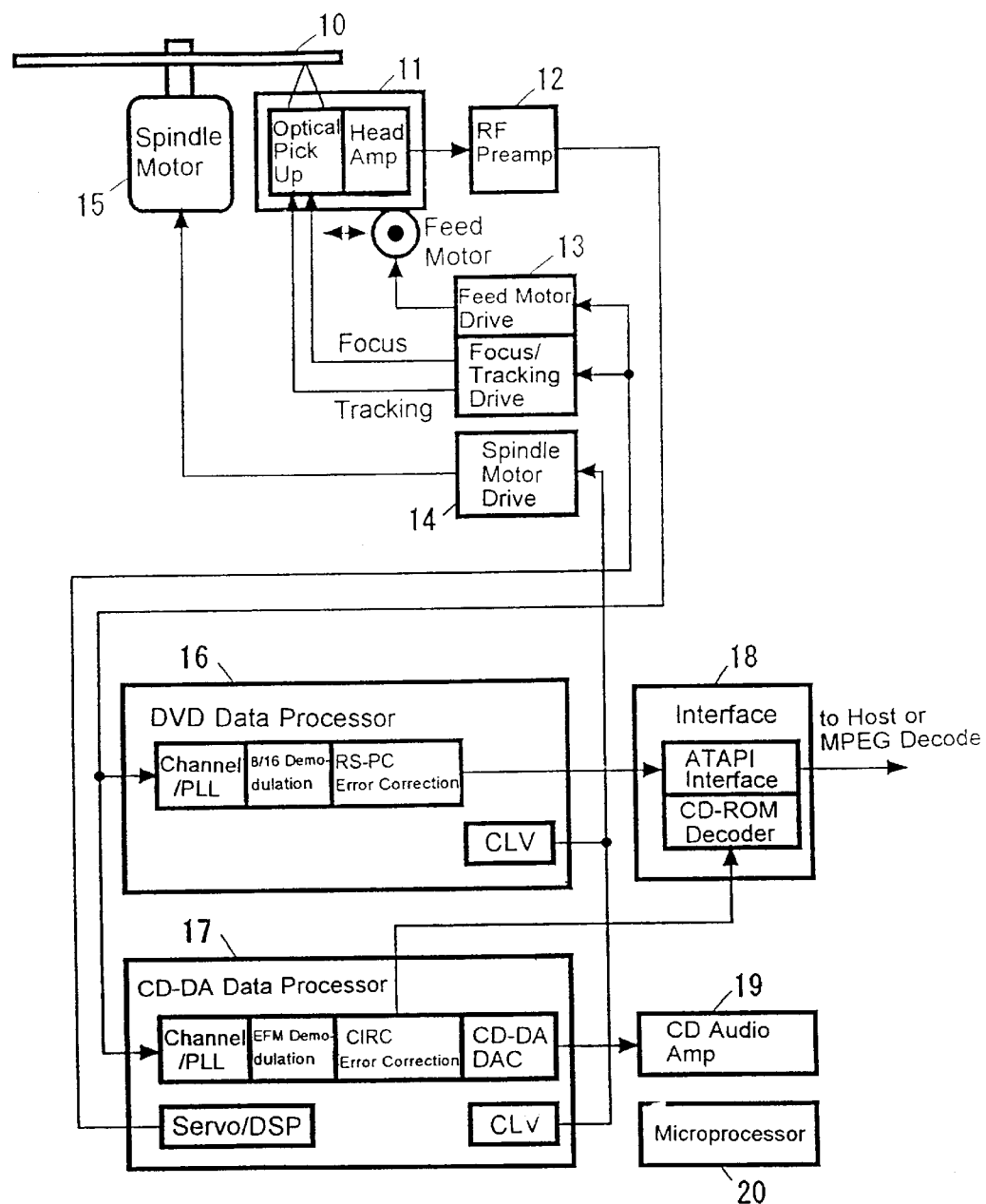
FIG. 1 is a schematic block diagram showing a conventional optical disk playback apparatus for playing back both of CD and DVD.
Figure 4:
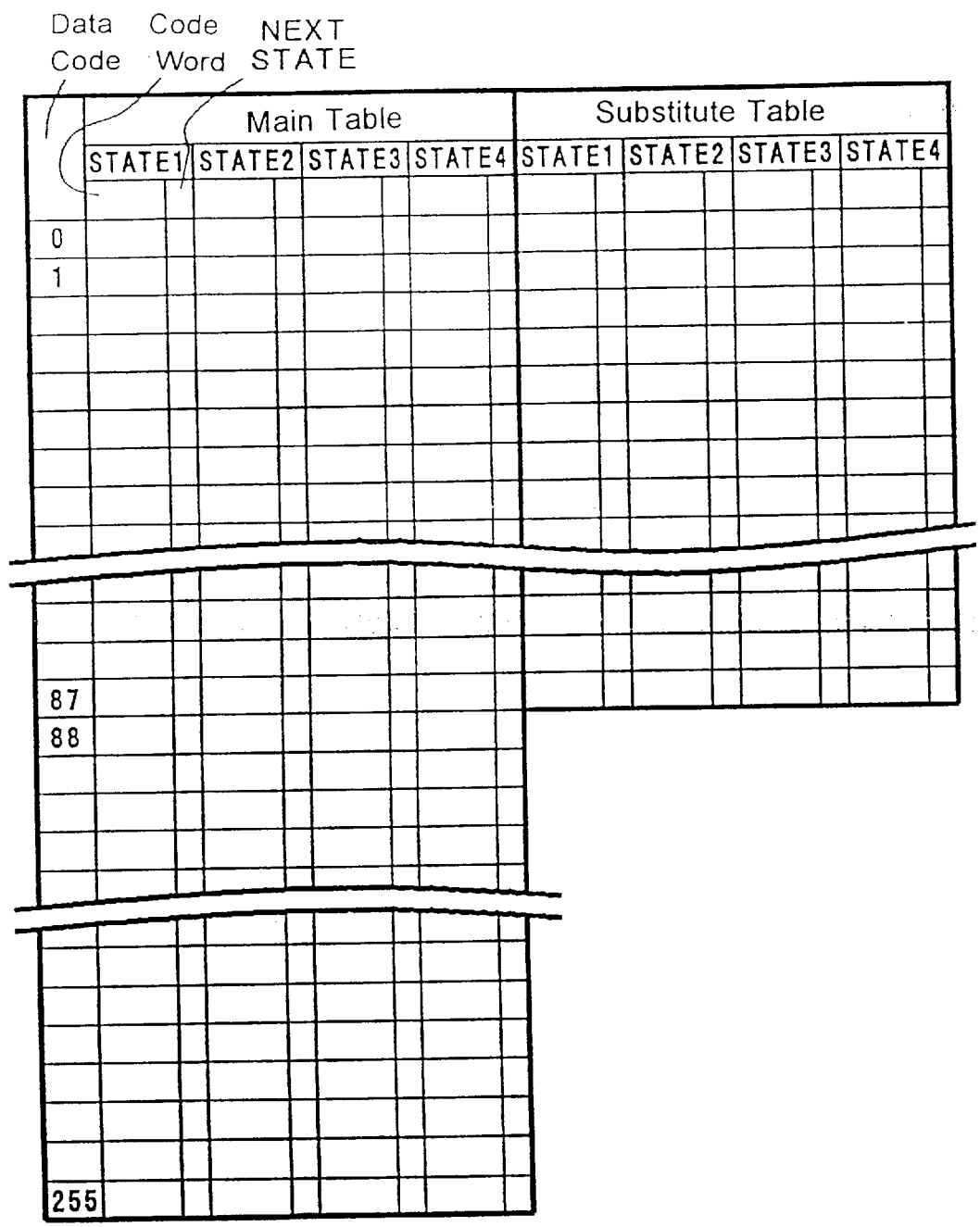
FIG. 4 is a diagram showing an overall configuration of a conversion table for 8/16 modulation.

On the other hand, in 8/16 modulation scheme adopted for DVD, 8 data bits (source) are encoded into 16 channel bits as one symbol. This is a modulation scheme that adopts the same RLL constraints as EFM modulation and is improved over EFM modulation in terms of higher recording density than EFM modulation without increasing DC-components. FIG. 3 shows a part of a conversion table for 8/16 modulation. More particularly, FIG. 3 shows a part of a main table for representing codewords of 16 bits long, which are divided into "STATE1" thru "STATE4" in association with the possible 256 data codes of 8 bits long respectively. Similarly to the conversion table for EFM modulation, data codes correspond to patterns of data bits, and codewords corresponds to patterns of channel bits. In FIG. 3, respective codewords are represented in binary numbers, whereas respective data codes are represented in decimal numbers for brevity of the drawing. In association with respective data codes, this main table assigns respective codewords of 16 bits long to STATE1 thru STATE4. Also, in association with data codes '0' thru '87', a substitute table assigns respective codewords of 16 bits long to STATE1 thru STATE4. Accordingly, as shown in FIG. 4, the conversion table for 8/16 modulation is arranged to associate possible 1,372 codewords (256×4=1,024 plus 87×4=348) of 16 bits long with the possible 256 data codes.

Now, with reference to FIG. 3, a method of performing 8/16 modulation will be described. In this case, patterns of channel bits are identified by an input to the modulator, an output of the modulator and STATE of the modulator in such a way that channel bits corresponding to data bits of one symbol are functions of the time relating to the modulation. Channel bits at instant "t" may be expressed by an output function "H" as $$X(t)=H(B(t), S(t))$$

where B(t) denotes data bits at instant "t", and "S(t) denotes a particular STATE of the modulator at instant "t". Further, NEXT STATE "S(t+1)", designating a state of data bits to be modulated at instant "t+1" (which is delayed by a one symbol period from instant "t"), may be expressed by a next state function "G" at instant "t" as $$S(t+1)=G(B(t), S(t)).$$

For an illustrative purpose, we will explain a case where data bits, represented in decimal numbers of '8', '3' and '4', are to be modulated in sequence. First, let the modulator be initialized to STATE1. When the data bits '8' are entered into the modulator, a codeword '0010000010010000' (which corresponds to the data code '8' and is included in STATE1 column of the conversion table) is output as channel bits. At the same time, NEXT STATE of the modulator is set to '3'. Next, when the data bits '3' are entered into the modulator, a codeword '0010000001001000' (which corresponds to the data code '3' and is included in STATE3 of the conversion table) is output as channel bits, and then NEXT STATE of the modulator is set to '2'. Subsequent channel bits '4' are output by using STATE2 column. Also, when a given data code resides within the range of '0' thru '87', codewords of the main table and substitute table are selected, thereby to reduce the accumulated DC-components.

Next, a method of demodulating patterns of modulated channel bits into patterns of data bits will be described. In EFM modulation, 3 margin bits (that contain no information) are discarded from a 17-bit stream recorded on CD, and from patterns of the remaining 14 channel bits, a corresponding data code is searched in accordance with the conversion table shown in FIG. 2. In EFM modulation, only one codeword is assigned to one data code and, thus, data bits can be directly obtained by referring to a codeword in the conversion table.

Operations of 8/16 demodulation are more complicated, however, since a plurality codewords are assigned to one data code and STATE variables are used. By way of example, as seen from STATE1 column of FIG. 3, pairs of data codes such as '3' and '7' or '5' and '6' are represented by the same codeword '0010000001001000' or '001000000100100' respectively. Accordingly, 8/16 demodulation cannot be done solely from patterns of channel bits at instant "t". As a general feature of the conversion table for 8/16 modulation, it has been observed that whenever there exists two identical codewords included in a single STATE, one of the codewords must designate '2' at its NEXT STATE and another one of the codewords must designate '3' at its NEXT STATE. All of the codewords included in STATE2 have 'ZEROS' in their highest bits (i.e., 15th bit according to a convention that the lowest bit position is defined as 0th bit (the same convention shall apply hereafter)) and 3rd bits respectively. Also, all of the codewords included in STATE3 must have 'ONES' in their highest bits and/or 3rd bits respectively. Accordingly, when channel bits are to be demodulated at instant "t" under such a circumstance where identical codewords included in a single STATE correspond to two data codes, 3rd and 15th bits of codewords included in either STATE2 or STATE3 at instant "t+1" are referred to, and a STATE of the said codeword (either STATE2 or STATE3) is identified.

Next, with reference to FIG. 3, we will explain a exemplary case where data codes, represented in decimal numbers of '3' and '4', are to be successively demodulated at instants "t" and "t+1" respectively. Assuming that the decimal number of '3' was modulated at STATE1, a pattern of channel bits '0010000001001000' appears at instant "t" to represent a codeword '3'. However, at this point of time, it is not known whether or not this pattern of channel bits represents the data code '3'. This is because another identical codeword appears at the place of a decimal number '7' in STATE1 as well. As described above, a successively appearing pattern of channel bits, which corresponds to the decimal number '4', should have a codeword that is included in either STATE2 or STATE3. If 15th and 3rd bits of the said pattern of channel bits to be decoded at instant "t+1" are examined, and a logical inversion (NOT) of its logical ORed result is '1', it indicates that the pattern of channel bits is a pattern included in STATE2, and that the data bits at instant "t" correspond to the decimal number '3'. Conversely, if a logical inversion of the logical ORed result is '0', it indicates that the pattern of channel bits is a pattern included in STATE3, and that the data bits at instant "t" correspond to the decimal number '7'. With respect to the last channel bits, it is possible to obtain a NEXT STAGE function by using patterns of channel bits that are regenerated from a read-out area.

Figure 5:
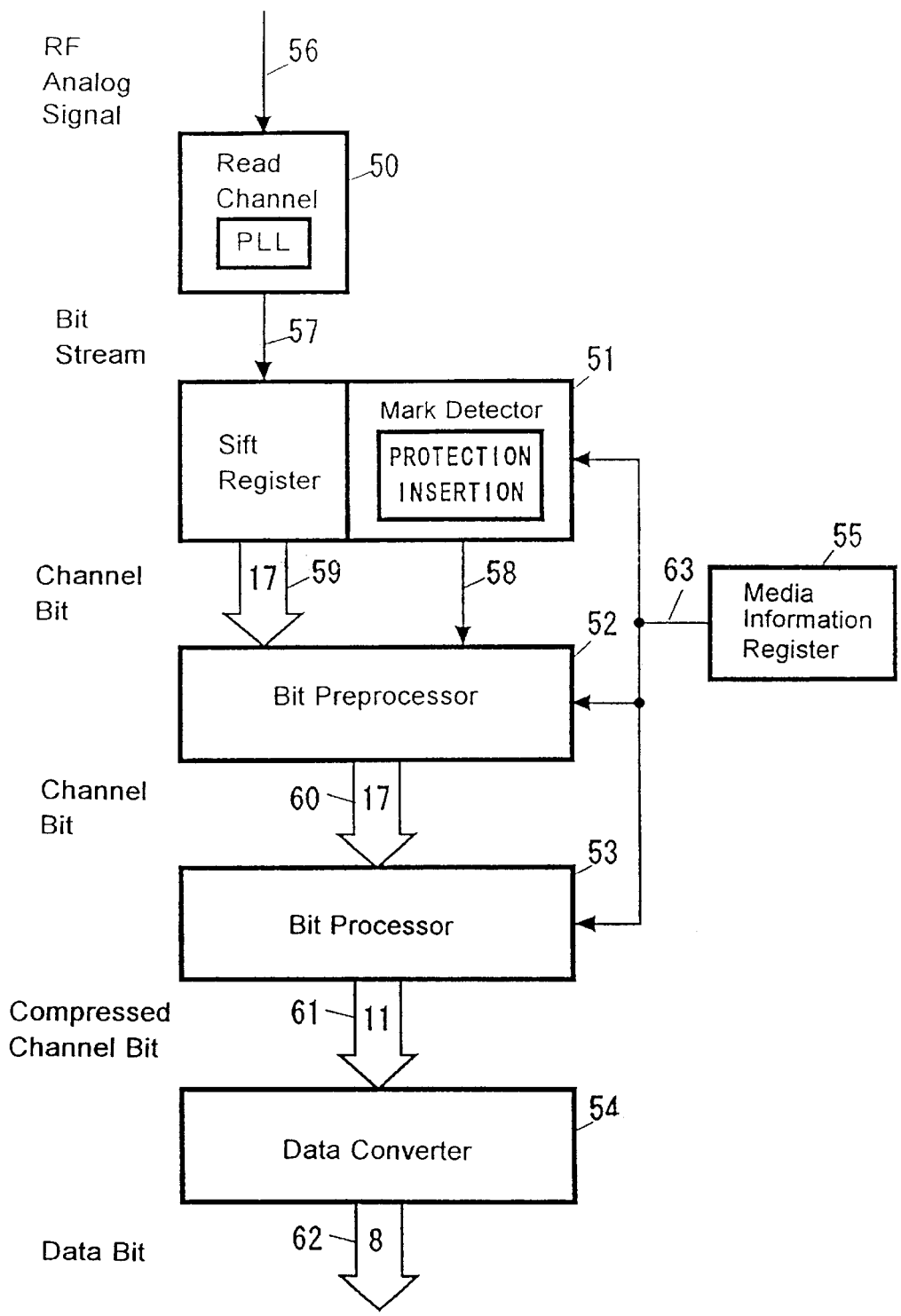
FIG. 5 is a functional block diagram showing an embodiment of demodulation circuitry in accordance with this invention.

FIG. 5 is a functional block diagram showing an embodiment of demodulation circuitry in accordance with this invention. This demodulator comprises a read channel 50 for receiving analog signals, a mark detector 51 connected to read channel 50, a bit preprocessor 52 connected to mark detector 51 via a line 58 and a data bus 59 of 17 bits wide, a bit processor 53 connected to bit preprocessor 52 via a data bus 60 of 17 bits wide, a data converter 54 connected to bit processor 53 via a data bus 61 of 11 bits wide, and a media information register 55 connected to mark detector 51, bit preprocessor 52 and bit processor 53 respectively. These components are not necessarily implemented by an integrated unit formed on a single LSI, but they may be alternatively implemented as a combination of individual ICs or as a large scaled LSI that accommodates another LSI including other circuit portions.

Read channel 50, having a PLL mechanism, digitizes RF analog signals sent from an RF preamplifier and regenerates clock signals for use in the demodulator from the RF analog signals. Mark detector 51 initially detects sync bits in a bit stream from CD or DVD and, then, it extracts a boundary position of a symbol for every 14 or 16 bits from channel bits that follow the sync bits in a predetermined pattern in accordance with a bit stream configuration of the involved medium, thereby to send a symbol boundary signal to bit preprocessor 52 via line 58. Also, when a sync bit cannot be detected due to occurrence of its dropout or a noise introduced therein, mark detector 51 corrects it and takes a protective action for preventing an erroneous channel bit from being confused with a sync bit. Further, a shift register provided in mark detector 51 converts a serial stream of channel bit into parallel channel bits, which are then consecutively sent to bit preprocessor 52 via data bus 59.

When the involved medium is DVD, bit preprocessor 52 calculates NEXT STATE from the received channel bits and determines a logical constant of NEXT flag bit. Also, it divides the consecutively received parallel channel bits into a 16-bit group for each symbol in accordance with the symbol boundary signal on line 58 and, then, sends it to bit processor 53 via data bus 60. Conversely, when the involved medium is CD, bit preprocessor 52 discards 3 margin bits from 17 channel bits, divides channel bits into a 14-bit group for each symbol in accordance with the symbol boundary signal, and sends it to bit processor 53 via data bus 60.

Bit processor 53 receives the parallel channel bits divided into groups associated with respective symbols, and performs predetermined bit operations (to be described) to generate converted address bits. Data converter 54 includes a ROM and a memory controller. This ROM is created in such a way that a plurality of first address patterns corresponding to patterns of channel bits included in the conversion table for 8/16 modulation, and a plurality of second address patterns corresponding to patterns of channel bits included in the conversion table for EFM modulation are associated with patterns of respective data bits. Numbers of bits required for designating said plurality of first and second address patterns are equal to the numbers of address bits that have been converted by bit processor 53. Since, in the present embodiment, said plurality of second address patterns are assigned to discontinuous areas of said plurality of first address patterns, an address space of this ROM may be kept within a limit that is necessary for representing said first address patterns. Data structure of this ROM will be described in detail below. The memory controller controls a read-out operation of the ROM for accessing the ROM by address bits to read a pattern of data bits therefrom. Data bus 62 of 8 bits wide sends the output pattern of data bits to a next stage. Media information register 55 provides media information to mark detector 51, bit preprocessor 52 and bit processor 53 to indicate whether the involved medium under demodulation is CD or DVD, whereby those components requiring different processing for CD and DVD respectively are caused to be operated in an appropriate manner.

Figure 6:
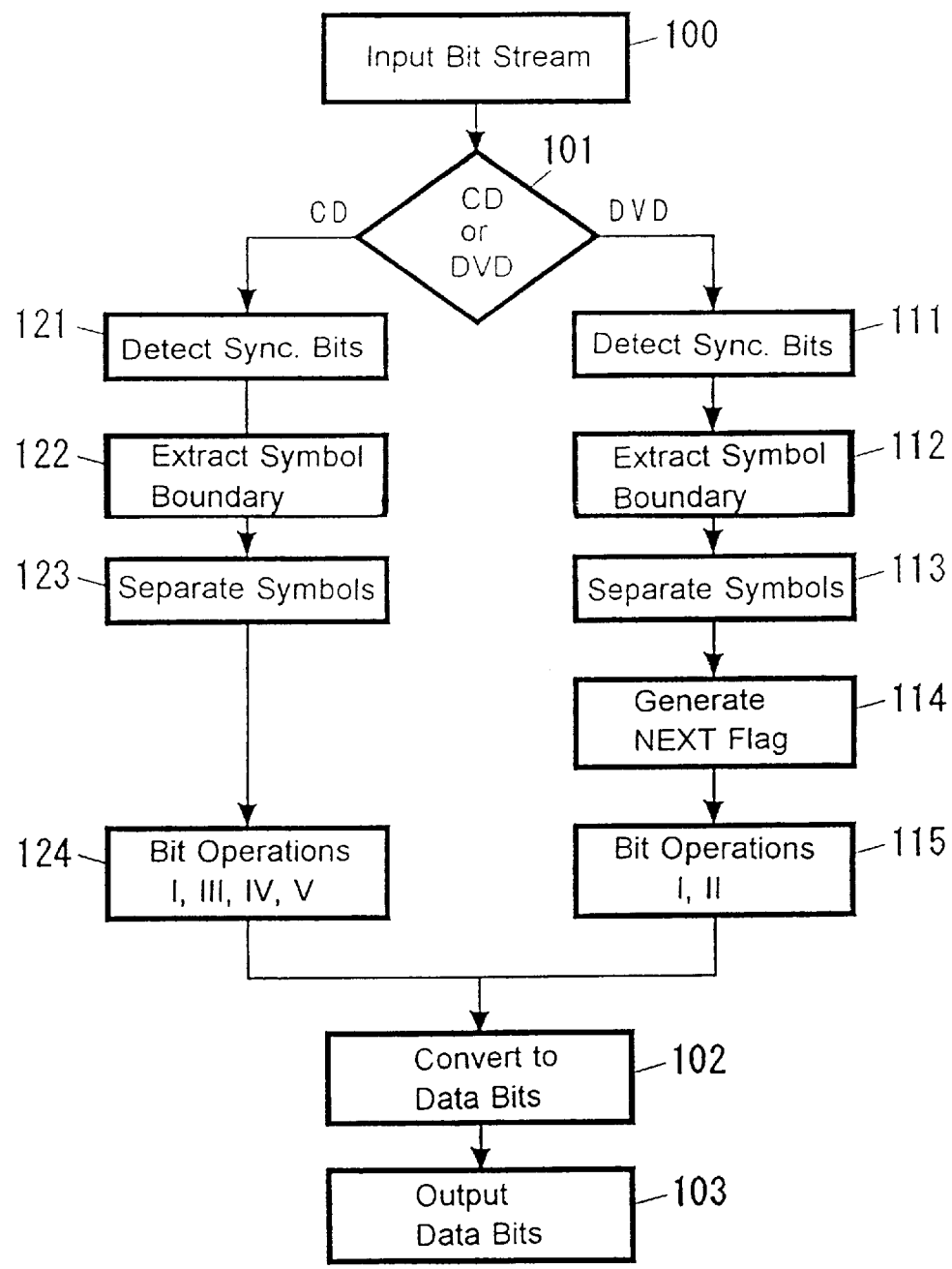
FIG. 6 is a flowchart showing an embodiment of a bit conversion method and a demodulation method in accordance with this invention.
Figure 7A:
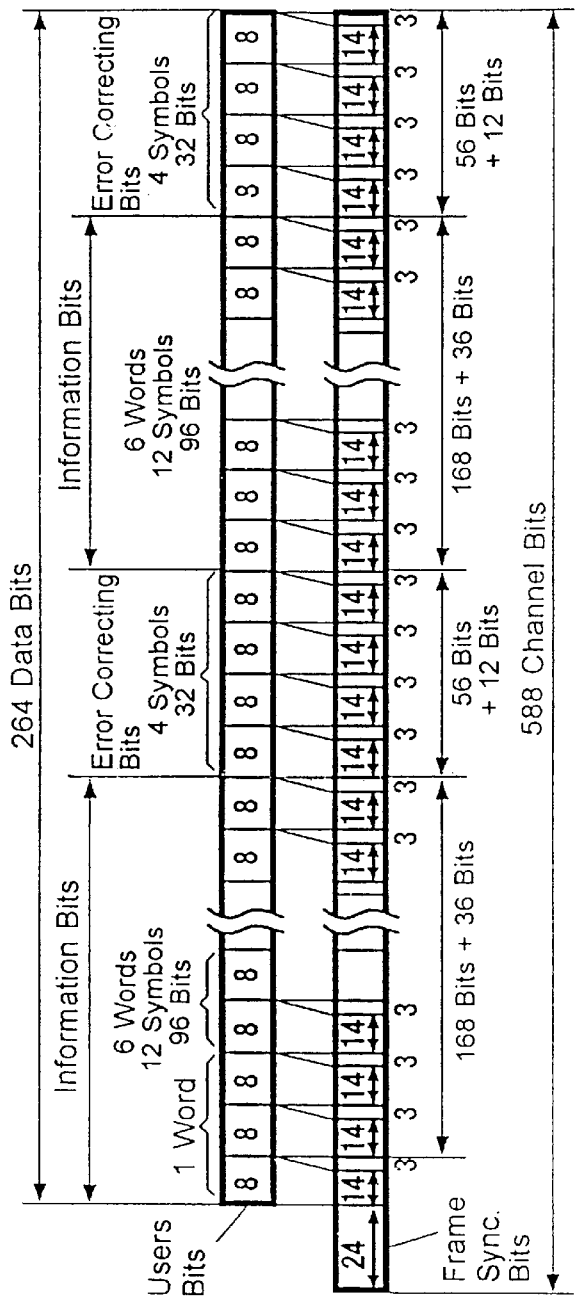
FIG. 7 is a diagram showing frame bit structures for both of CD and DVD.
Figure 7B:
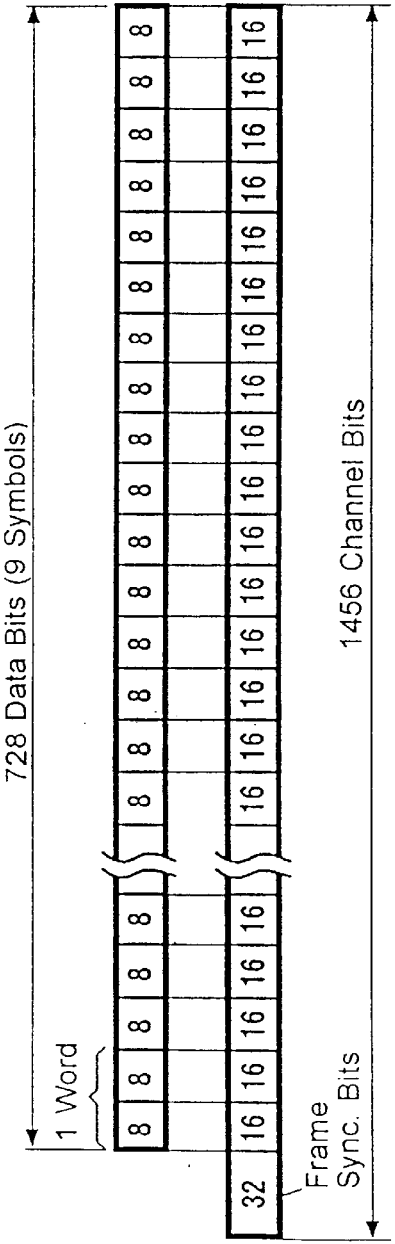

FIG. 6 is a flowchart showing an embodiment of a demodulation method in accordance with this invention. At block 100, a stream of channel bits from either CD or DVD is consecutively entered into the demodulation stage. In FIG. 7, there is shown structure of bit streams from both of CD and DVD. FIG. 7(a) shows frame bit structure for one frame employed in EFM modulation scheme, whereas FIG. 7(b) shows frame bit structure for one frame employed in 8/16 modulation scheme. In the frame bit structure for EFM modulation, information bits and error correcting bits are divided into an 8-bit group for each symbol, whereby each symbol is converted to 14 channel bits, and 3 margin bits are added between symbols. At the forefront of this structure, there are 24 frame sync bits comprising bit patterns that do not overlap with channel bits. In the frame bit structure for 8/16 modulation, however, following 32 frame sync bits, there are consecutive 91 symbols each comprising 16 channel bits. In either case, whenever a deviation or drift occurs in regenerated information due to a data loss (dropout) or wobbling of time axis (jitter), the sync bits are used for performing synchronization on a frame basis to prevent a persistent deviation or drift. It should be understood, however, that this invention is not necessarily limited to application to the aforesaid frame bit structure alone, but it may be well applied to another frame bit structure comprising a symbol of 16 bits or 14 bits long.

At block 101 (FIG. 6), it is determined whether an optical disk to be played back is CD or DVD. For this purpose, a well known method for identifying a medium may be used. Since the frame bit structures and the patterns of channel bits modulated in accordance with 8/16 and EFM modulation schemes are different from each other (see FIG. 7 and its accompanied description), the succeeding blocks include different two flows of stages for separately handling channel bits of 8/16 and EFM modulations respectively. If the involved medium is DVD, at blocks 111 thru 115, a pattern of channel bits for 8/16 modulation (where each symbol comprises 16 bits) is converted to a 10-bit pattern, and a single NEXT flag bit is then added thereto for generating a pattern of 11 address bits. Conversely, if the involved medium is CD, at blocks 121 thru 124, a pattern of channel bits for EFM modulation (where each symbol comprises 14 bits) is converted to a 11-bit pattern for generating a pattern of 11 address bits. At block 102, the resultant pattern of address bits is further converted to a pattern of data bits before-modulation by using a demodulating reference table, which may be used for demodulating patterns of channel bits modulated in accordance with both of 8/16 and EFM modulation schemes. At block 103, a pattern of the demodulated data bits is sent to a next stage.

Next, each of the blocks will be explained in more detail. At block 111, when a channel bit stream for 8/16 modulation having the frame bit structure shown in FIG. 7(b) is entered with frame sync bits in the lead, these frame sync bits are detected at the outset, thereby to recognize beginning of a frame and immediately succeeding channel bits that comply with the frame bit structure for 8/16 modulation. At block 112, a symbol boundary signal for each 16-bit symbol is extracted from the channel bit stream. At block 113, the channel bit stream is consecutively divided into a group for each 16-bit symbol in accordance with the symbol boundary signal. At block 114, 3rd and 15th bits of a present 16-bit symbol are logically ORed and, then, it is further logically inverted to generate a NEXT flag. Namely, if the NEXT flag at instant "t+1" exhibits '1', it indicates that a codeword shown in FIG. 3 at instant "t" should have NEXT STATE being indicative of '2'.

Figure 8:
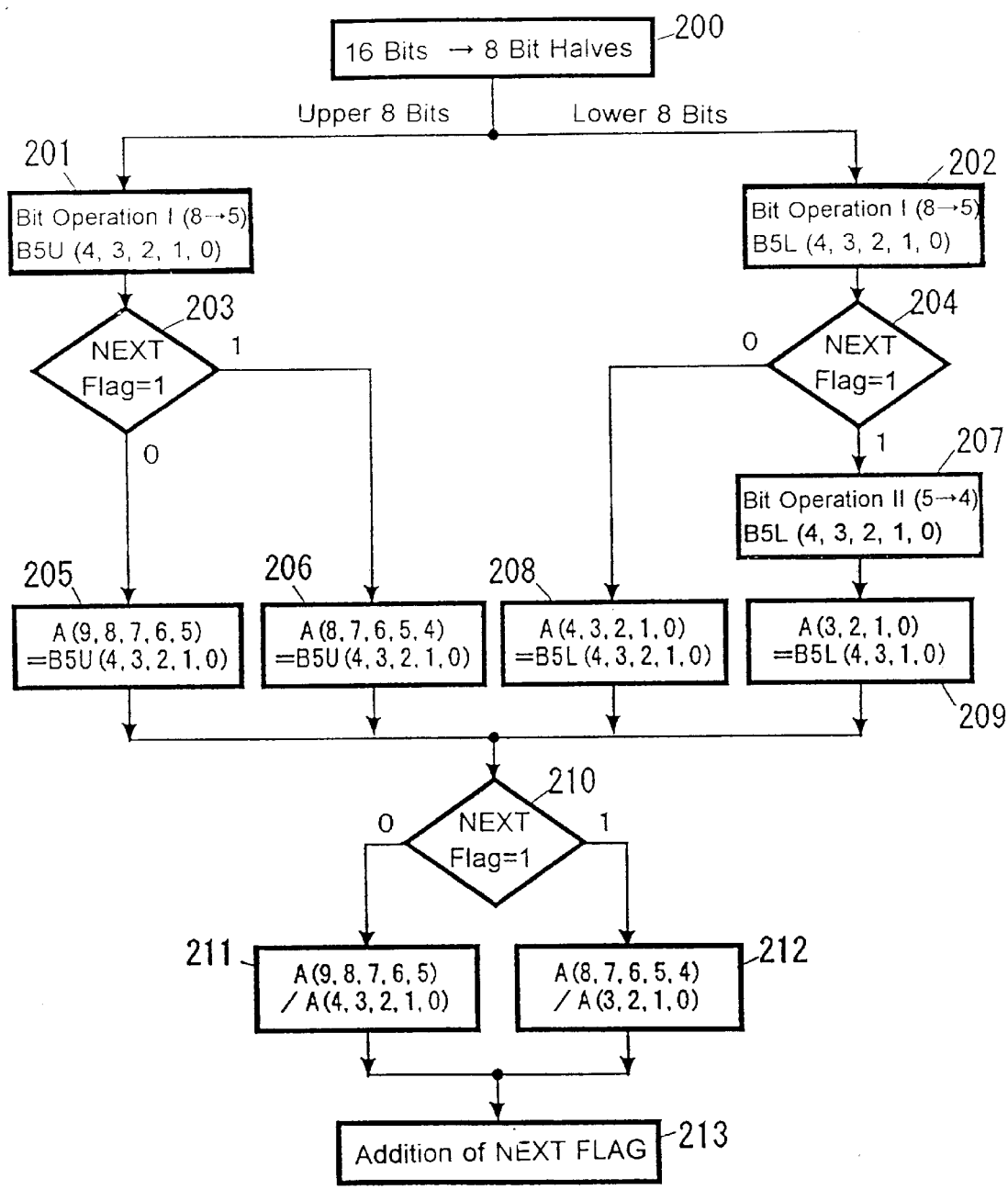
FIG. 8 is a flowchart showing details of block 115 shown in FIG. 6.

At block 115, channel bits for each 16-bit group are converted to 10 bits, and a NEXT flag bit is added thereto for generating 11 address bits. FIG. 8 shows a detailed flowchart of this block 115.

Prior to describing bit operations at block 115, fundamental operational equations for converting 16 bits to 10 bits will be described. As seen from the above, the possible 1,372 codewords for 8/16 modulation may be sufficiently represented by using 11 bits, which enable to identify one of possible 2,048 items. Thus, assuming that 1 bit of the NEXT flag bit be left for address bits, we have contemplated a method that has the best compression rate and is adapted for converting the remaining 16 bits to 10 bits. We have picked up an arbitrary number of bits within the limit of 16 bits, counted a number of possible patterns that the arbitrary number of bits exist under the RLL (2, 10), and calculated a number of bits required for the said number of patterns. Having performed calculations for all cases, it has been found that a particular case for converting 8 bits to 5 bits has the best compression rate.

Figure 9:
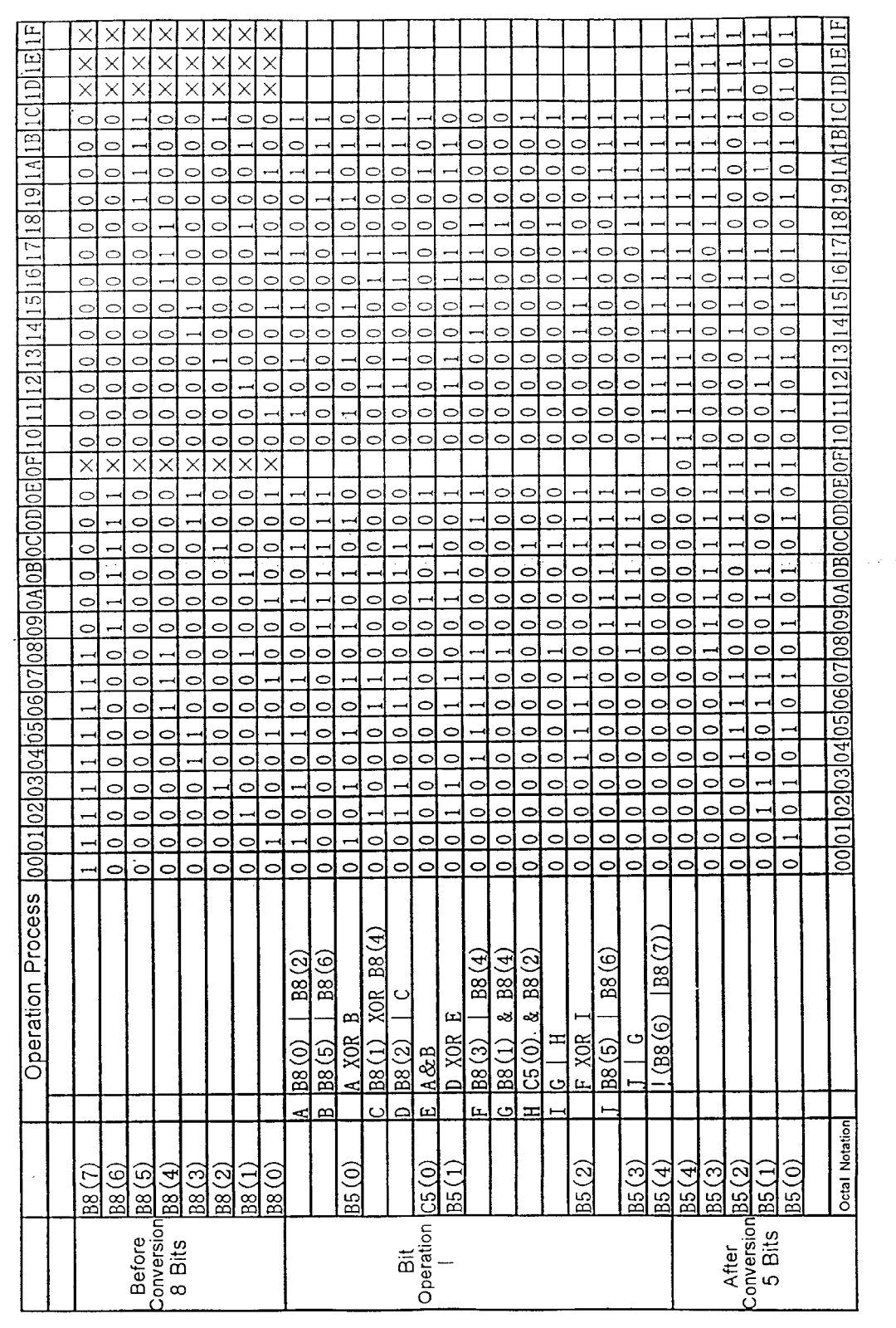

If a number of bits of channel bits subject to a conversion is selected to be 8 bits, it becomes possible to divide a 16-bit symbol into upper and lower 8-bit halves, thereby to process the respective halves using the same circuitry. The upper and lower 8-bit halves represent those patterns respectively, which comply with the RLL constraints for 8/16 modulation and have the minimum run-length being equal to '2'. Note in this respect that, for a set of 8-bits, a value of the maximum run-length does not regulate patterns thereof. As shown in FIG. 9, there are possible 28 patterns of respective 8 bits. A set of 8 bits before-conversion, shown in FIG. 9, represent the possible 28 patterns, which have at least '2' run-lengths of 'ZEROS' respectively, ranging from '10000000' to '00100100'.

Then, we have analyzed the possible 28 patterns of respective 8 bits shown in FIG. 9, and developed fundamental operational equations for converting these patterns to associated patterns of 5 bits as defined below.

$$B5(4)=!(B8(6)|B8(7)) \quad (1)$$

$$B5(3,2,1,0)=(0001b \ \& \ B8(0)+(0010b \ \& \ B8(1)+(0011b \ \& \ B8(2)+ \\ (0100b \ \& \ B8(3)+(0110b \ \& \ B8(4)+(1001b \ \& \ (B8(5)|B8(6)) \quad (2)$$

Equation (2) includes logical and arithmetic operations of binary numbers. The term "B8(n)" denotes a logical variable (having a value of either '1' or '0') of a bit, which is located at n-th bit position from the least significant bit of 8 bits labeled "before-conversion" in FIG. 9. Similarly, the term "B5(m)" denotes a logical variable of a bit, which is located at m-th bit position from the least significant bit of 5 bits labelled "after-conversion" in FIG. 9. The notation "|" is a logical OR operator, "&" is a logical AND operator, "!" is a logical NOT operator, and "+" is an arithmetic operator denoting addition. 4-digit number of '1' or '0' is a logical operand, whereas the notation "b" at the rightmost end indicates that the operand is represented in a binary form.

For converting 8 bits to 5 bits, a processor may be caused to execute a program for directly performing calculations defined by equations (1) and (2). However, it is preferable to perform such calculations by means of wired logic circuitry (comprising a combination of logic elements) rather than a processor, since bit processing for demodulation has to be performed in a high-speed and consecutive manner. Now, with reference to FIG. 8 showing a detailed procedure of block 115 (FIG. 6), we will explain logical equations for defining logical variables of 5 bits that have been converted from 8 bits, thereby enabling to perform bit operations from equation (2).

At block 200, channel bits of 16 bits long are divided into upper and lower 8-bit halves. Then, the process moves to blocks 201 and 202 for performing operations on the upper and lower 8-bit halves respectively. More particularly, at blocks 201 and 202, bit operations I as defined by the logical operational equation (3) below are executed to calculate logical variables B5U(4,3,2,1,0) and B5L(4,3,2,1,0), which represent upper and lower 5 bits, from the upper and lower 8-bit halves respectively.

$$B5(0)=(B8(0)|B8(2))XOR(B8(5)|(B8(6)) \ C5(0)=(B8(0)|B8(2)) \ \& \\ (B8(5)|(B8(6)) \ B5(1)=(B8(2)|(B8(1)XOR \ B8(4)))XOR \ C5(0) \\ B5(2)=(B8(3)|B8 \ (4))XOR((B8(1) \ \& \ B8(4))|(C5(0) \ \& \ B8(2))) \\ B5(3)=(B8(5)|B8(6))|(B8(1) \ \& \ B8(4)) \ B5(4)=!(B8(6)|B8(7)) \quad (3)$$

In equation (3), the character "XOR" denotes a logical exclusive OR operator, and other characters or operators have the same meaning as those used in equations (1) and (2). Based on equation (3), it becomes possible to assign patterns of 5 bits to said possible 28 patterns of 8 bits respectively (which comply with the minimum run-length of '2' as set forth above). At block 201, the upper 5 bits of B5U(4,3,2,1,0) are generated from conversion of the upper 8-bit half. Whereas, at block 202, the lower 5 bits of B5L(4,3,2,1,0) are generated from conversion of the lower 8-bit half.

In FIG. 9, there is shown an operational process for associating said possible 28 patterns of 8 bits with pattern of 5 bits in accordance with the bit operations I, in addition to operational results obtained therefrom.

In the present embodiment, respective 5 bits converted from the lower 8-bit half are further converted to 4 bits in dependence on a value of the NEXT flag bit and, then, the said 4 bits are combined with the upper 5 bits and the NEXT flag bit to generate address bits of 10 bits long. Let us explain this below with reference to the flowchart of FIG. 8 again. At blocks 203 and 204, it is determined whether the NEXT flag bit generated at block 113 of FIG. 6 is '1' or '0'. For address bits A(y) of maximal 11 bits long, the NEXT flag bit is assigned to its highest bit, whereas those 10 bits or 9 bits that have been obtained by conversion from channel bits of 16 bits long are assigned to 10 bits of A(9) thru A(0). With respect to the upper 8-bit half, if the NEXT flag bit is found to be '0' at block 203, then at block 205, said upper 5 bits of B5U(4,3,2,1,0) that have been obtained by conversion from the upper 8-bit half are assigned to A(9,8,7,6,5) of the address bits A(y). Conversely, if the NEXT flag bit is found to be '1' at block 203, then at block 206, said upper 5 bits of B5U(4,3,2,1,0) are assigned to A(8,7,6,5,4) of the address bits A(y). Note that if the NEXT flag bit is found to be '1' at block 203, no bit is assigned to A(9). This is because the lower 8-bit half is converted to 4 bits rather than 5 bits, as described in detail below.

With respect to the lower 8-bit half, if the NEXT flag bit is found to be '0' at block 204, then at block 208, said lower 5 bits of B5L(4,3,2,1,0) are assigned to address bits A(4,3,2,1,0). Conversely, if the NEXT flag bit is found to be '1' at block 204, then at block 207, bit operations II are executed to further convert said lower 5 bits to 4 bits. The NEXT flag bit being equal to '1' indicates that its codeword is included in STATE2. Referring to FIG. 3 for analyzing lower 8 bits of all of the codewords that designate '2' in their NEXT STATE columns, it is found that there are possible 10 patterns only. For example, as shown in FIG. 3, a codeword that belongs to STATE1 and is associated with a data code of decimal number '2' contains '2' in its NEXT STATE column, and its lower 8 bits are '00100000'. According to the bit operations I, this pattern corresponds to an octal number '19' and a 5-bit pattern '11001' as shown in FIG. 9, which in turn corresponds to one of possible 10 patterns as shown in FIG. 11. Since the possible 10 patterns may be represented by 4 bits, a simplified method is used in the present embodiment in such a way that B5L(2) is disregarded and the lower 5 bits are converted to 4 bits to obtain the resultant 4 bits, in accordance with the bit operations II as defined by equation (4) below. It should be understood, however, that a method of converting 5 bits to 4 bits is not limited to this embodiment, but another alternative method may be used as well.

$$B5(0)=B4(0)\ B5(1)=B4(1)\ B5(3)=B4(2)\ B5(4)=B4(3) \quad (4)$$

At block 209, the 4 bits of B5L(4,3,1,0) are assigned to address bits A(3,2,1,0). At the next block 210, a value of the NEXT flag bit is evaluated again and, if it is '0', the process moves to block 211 where A(9,8,7,6,5) and A(4,3,2,1,0) generated at blocks 205 and 208 respectively are concatenated together. Conversely, if a value of the NEXT flag bit is '1', the process moves to block 212 where A(8,7,6,5,4) and A(3,2,1,0) generated at blocks 206 and 209 respectively are concatenated together. Accordingly, when the NEXT flag bit is '0', 16 channel bits have been converted from 16 bits to 10 bits, and when the NEXT flag bit is '1', the channel bits have been converted to 9 bits. At step 213, the NEXT flag bit of 1 bit long is assigned to A(a), thereby to finally generate address bits of 11 bits or 10 bits long.

Explaining the results of said bit operations with reference to FIG. 3, when the NEXT flag bit is '0', it follows that codewords other than those codewords, designating '2' in their NEXT STATE columns, have been converted from 16 bits to 10 bits. Conversely, when the NEXT flag bit is '1', codewords that designate '2' in their NEXT STATE columns have been converted form 16 bits to 9 bits.

Figure 10:
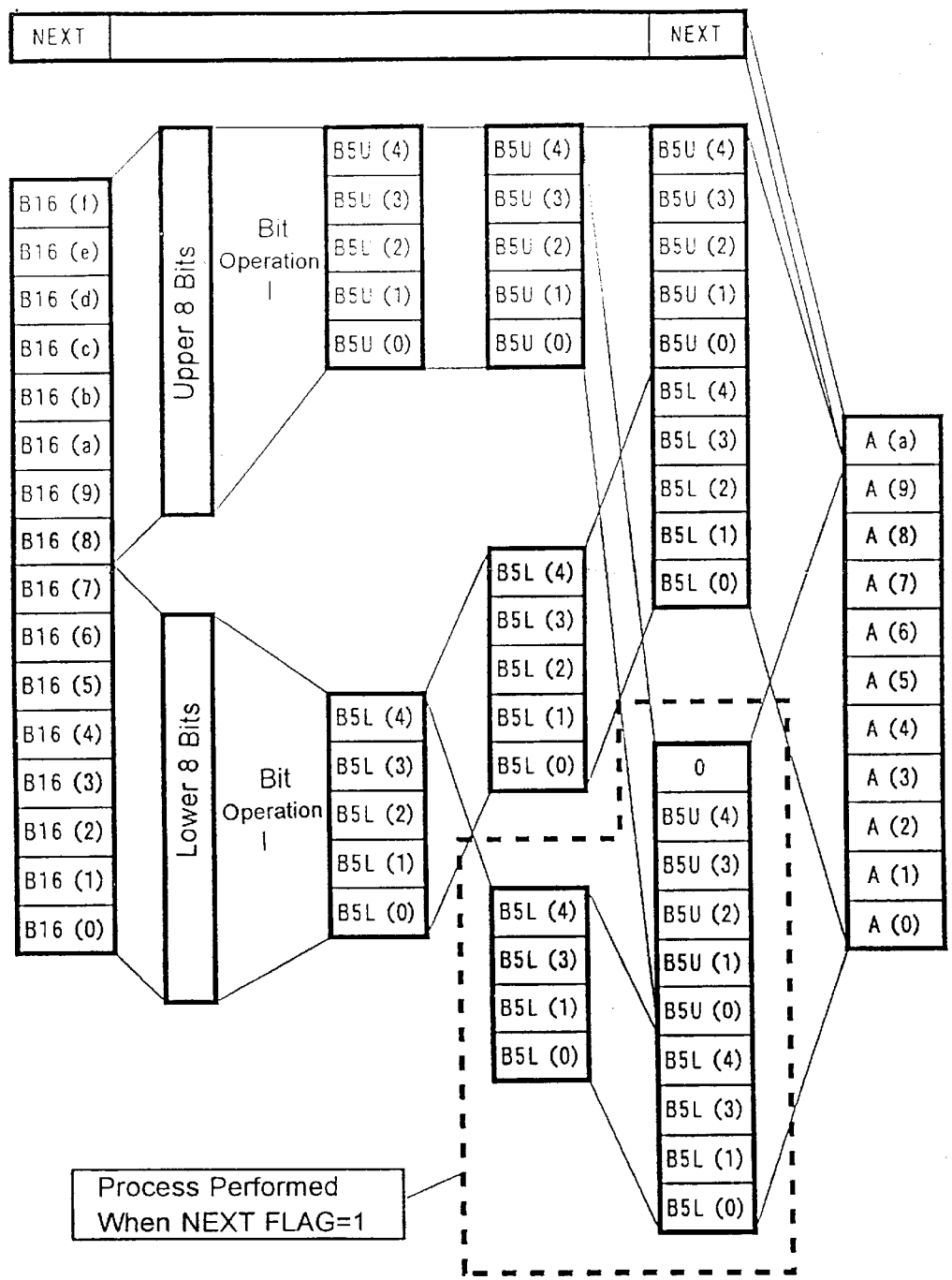
FIG. 10 is a diagram showing relationships between an operational process for converting 8/16 modulated channel bits and a bit structure.

Having thus executed the bit operations I for converting channel bits of 16 bits long to address bits of 11 bits long, it becomes possible to reduce data buses in the operational circuitry. The address bits of 11 bits long may be used for addressing a reference table for 8/16 demodulation. FIG. 10 shows a conceptual view of the bit conversions that are executed by the aforesaid operations.

Now, referring to FIG. 6 again, we will explain a procedure of blocks 121 thru 124 for processing channel bits of EFM modulation. At block 121, when a channel bit stream for EFM modulation having the frame bit structure shown in FIG. 7(a) is entered with frame sync bits in the lead, these frame sync bits are detected at the outset, thereby to recognize beginning of a frame and immediately succeeding margin bits, channel bits and parity bits in the order shown in FIG. 7(a). At block 122, the margin bits of 3 bits long are discarded to generate a symbol boundary signal for each 14-bit symbol. At block 123, the channel bit stream is consecutively divided into a group for each 14-bit symbol in accordance with the symbol boundary signal. In case of EFM modulation, there is no need to generate a NEXT flag bit as done at block 114.

Figure 12:
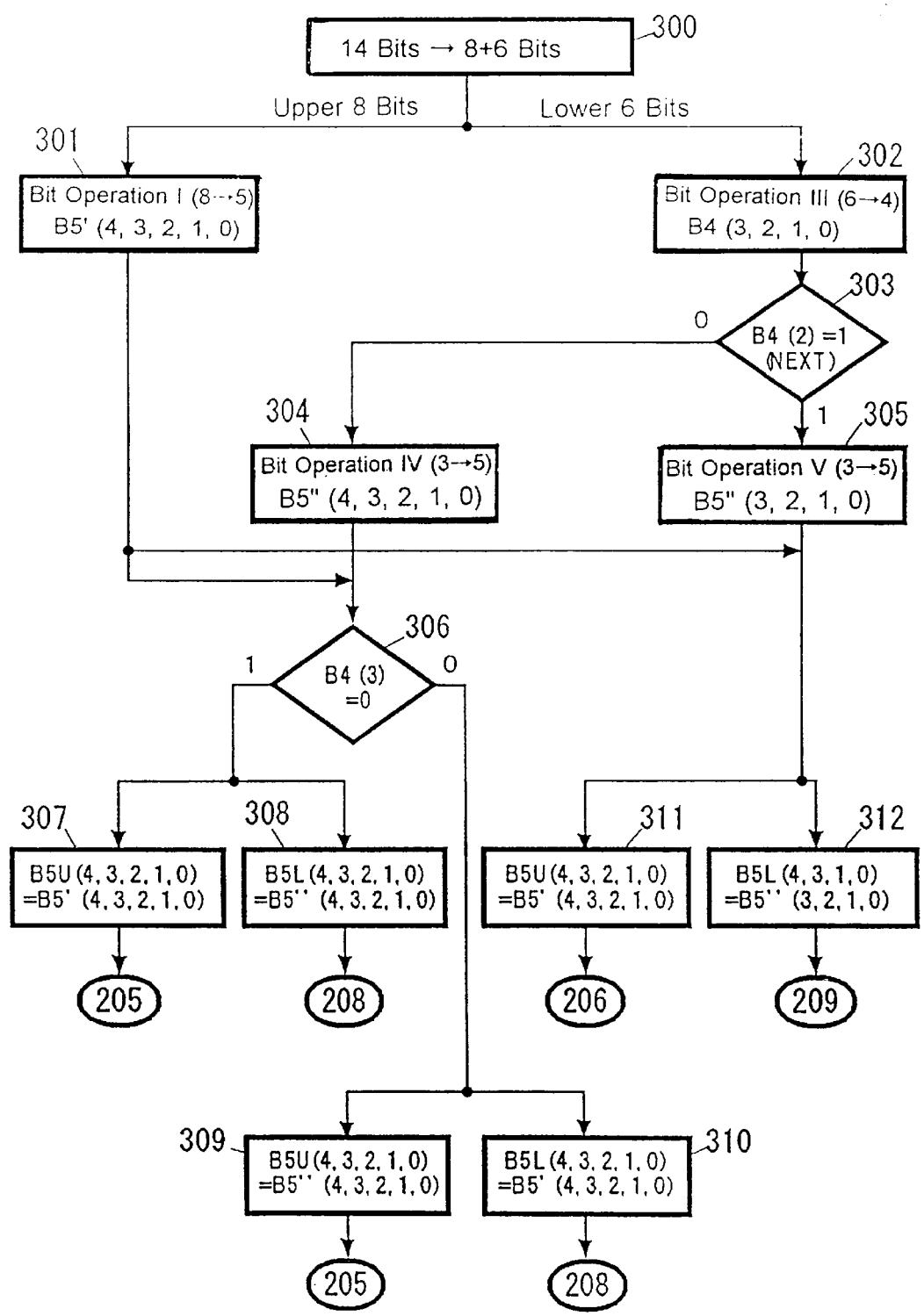
FIG. 12 is a flowchart showing details of block 124 shown in FIG. 6.

Then, the process moves to block 124 where channel bits for each 14-bit group are converted to 10 bits, and a single bit that is constructively generated to match the NEXT flag bit is added thereto for generating address bits of 11 bits long. Now, with reference to FIG. 12, operations at this block 124 will be described in detail. Note here that a primary goal for converting channel bits of 14 bits long to 11 bits is to represent patterns in discontinuous areas of the patterns of address bits, which have been obtained by converting channel bits of 8/16 modulation in accordance with the method of FIG. 8.

At block 300, channel bits of 14 bits long are divided into upper 8 bits and lower 6 bits. Then, the process moves to blocks 301 and 302 for performing operations on the upper 8 bits and lower 6 bits respectively. More particularly, at blocks 301, the bit operations I (see the aforesaid description of signal processing for 8/16 modulation) are executed to convert the upper 8 bits to 5 bits of B5'(4,3,2,1,0) and, then, the process moves to subsequent blocks 306, 311 and 312. On the other hand, at block 302, bit operations III are executed to convert the lower 6 bits to 4 bits of B4(3,2,1,0). The bit operations III are arranged in such a way that the lower 6 bits are divided into 3-bit halves, these 3-bit halves are converted to 2 bits respectively and, then, a pair of the converted 2 bits are concatenated to generate 4 bits. The bit operations III have been developed by noticing a point that when a stream of 3 bits from the lowest bit to 3rd bit and another stream of 3 bits from 4th bit to 6th bit are extracted from said lower 6 bits, each of the 3-bit streams has possible 4 patterns only under the minimum run-length of '2', as listed below.

| 3-Bit Pattern | Two Bits After Conversion | |
|---|---|---|
| 000 | 00b | |
| 001 | 01b | |
| 010 | 10b | (5) |
| 100 | 11b | |

At block 303, it is determined whether 3rd bit B4(2) of the 4 bits, having been obtained through the bit operations III, is '1' or '0'. A value of 3rd bit B4(2) is used during the subsequent processing in the same manner as the NEXT flag bit for 8/16 modulation. If 3rd bit B4(2) is '0', then at block 304, bit operations IV defined by equation (6) below are executed to obtain 5 bits of B5"(4,3,2,1,0) from 3 bits of B4(3,1,0) excluding 3rd bit B4(2).

$$B5''(0)=B4(0)|!(B4(0)|B4(1))\ B5''(1)=B4(1)|!(B4(0)|B4(1))\ B5''(2)=1$$
$$B5''(3)=1\ B5''(4)=B4(0)|B4(1) \quad (6)$$

At the next block 306, it is determined whether B4(3) is '1' or '0'. If B4(3) is '1', then at blocks 307 and 308, B5U(4,3,2,1,0) and B5L(4,3,2,1,0) are determined respectively in accordance with equation (7) below and, thereafter, the process moves to blocks 206 and 208 of FIG. 8 to assign address bits in the same manner as 8/16 modulation.

$$B5U(4,3,2,1,0)=B5'(4,3,2,1,0) \ B5L(4,3,2,1,0)=B5''(4,3,2,1,0) \quad (7)$$

Conversely, if B4(3) is found to be '0' at block 306, then at blocks 309 and 310, B5U(4,3,2,1,0) and B5L(4,3,2,1,0) are determined respectively in accordance with equation (8) below and, thereafter, the process moves to blocks 205 and 208 of FIG. 8 to assign address bits in the same manner as 8/16 modulation.

$$B5U(4,3,2,1,0)=B5''(4,3,2,1,0) \ B5L(4,3,2,1,0)=B5'(4,3,2,1,0) \quad (8)$$

Returning to block 303, if 3rd bit B4(2) is found to be '1' at this block, then the lower 4 bits are further converted to other 4 bits. Namely, at block 305, bit operations V as defined by equation (9) below are executed to obtain 4 bits of B5''(3,2,1,0) from 3 bits of B4(3,1,0) excluding 3rd bit B4(2).

$$B5''(0)=B4(0)|B4(1) \ B5''(1)=!B4(0)|!B4(3) \ B5''(2)=!B4(0)|!B4(3)$$
$$B5''(3)=(B4(0) \ \& \ B4(1))|B4(3) \quad (9)$$

At the next blocks 311 and 312, B5U(4,3,2,1,0) and B5L(4,3,1,0) are determined in accordance with equation (10) below and, thereafter, the process moves to blocks 206 and 209 of FIG. 8 to assign address bits in the same manner as 8/16 modulation.

$$B5U(4,3,2,1,0)=B5'(4,3,2,1,0) \ B5L(4,3,1,0)=B5''(3,2,1,0) \quad (10)$$

Accordingly, when B4(2) is '0', channel bits of 14 bits long have been converted to 10 bits, and when B4(2) is '1', the channel bits have been converted to 9 bits. More importantly, it should be noted that patterns of address bits of 11 bits long, which have been obtained by said operations in association with patterns of channel bits, are generated completely differently from those patterns of the address bits for 8/16 modulation, and that the former patterns are generated in discontinuous areas of the latter patterns. Thus, as described below, this enables to consolidate respective reference tables for 8/16 and EFM demodulation into a single reference table, thereby to substantially reduce a memory address space required for storing the same.

FIG. 13 shows an operational process for converting EFM modulated channel bits. Since channel bits of 14 bits long have been successfully converted to address bits of 11 bits long through execution of the bit operations I and III, it becomes possible to reduce data buses in the operational circuitry and yet to share them with data buses used for processing of 8/16 modulation. Similarly to the bit operations I or II, the bit operations III, IV and V may be implemented by wired logic circuitry.

After generating address bits of 11 bits long at blocks 115 or 124 (FIG. 6), a reference table is referred to at block 102 for converting a pattern of the address bits to a pattern of data bits. In order to create a reference table for converting patterns of 8/16 modulated channel bits to patterns of data bits, the bit operations I or the bit operations I and II are executed at first in accordance with the procedure shown in FIG. 8 to obtain address patterns corresponding to all of the possible patterns of 8 bits that exist under the minimum run-length of '2'. Original channel bits may be obtained by concatenating two 8-bit patterns, whereas a corresponding pattern of data bits may be obtained by taking account of a NEXT flag bit. Thereafter, the reference table is created by associating the respective address patterns so obtained with the patterns of data bits. In case of storing the reference table into a memory, it is possible to associate respective address patterns with those address bits that are generated at block 115 or 124. By making use of address patterns of 11 bits long obtained through execution of the bit operations I alone, an address space of the reference table for 8/16 demodulation has been substantially reduced from 65,536 to 2,048. Further, by making use of address patterns of 11 bits and 10 bits long obtained through execution of the bit operations I and II, the address space of the demodulating reference table has been additionally reduced to 1,536=1,024+512.

Next, a reference table for EFM demodulation is created in such a way that unused areas within the address space of the reference table for 8/16 demodulation are effectively exploited and yet the said address space is in no way expanded. First, in accordance with the procedure shown in FIG. 12, the bit operations I are applied to possible patterns of the upper 8 bits that exist under the minimum run-length of '2', whereas the bit operations III, IV and V are applied to the lower 6 bits, thereby to obtain corresponding address patterns. Concatenating the 8-bit patterns to the 6-bit patterns, it is possible to obtain corresponding patterns of data bits. Thereafter, the reference table is created by associating the respective address patterns so obtained with the patterns of data bits. The said address patterns obtained through the bit operations I, III, IV and V are completely different from the address patterns for 8/16 demodulation, and the former address patterns may be assigned to discontinuous areas of the latter address patterns. Accordingly, the reference table for EFM demodulation has been consolidated into the reference table for 8/16 demodulation without requiring to increase the maximum address space thereof.

An address space of the reference table so consolidated is much smaller than the sum of the individual reference tables for EFM and 8/16 demodulation as demonstrated by actual calculation of 1,487. Even if the address space is 1,487, it may happen that a memory space of a commercially available memory is wasted since such a memory is set to have a stepwise capacity. However, in a case where a ROM for storing a demodulating reference table together with signal processing circuitry are built into an LSI, it is possible to set a finer memory capacity, thereby to avoid waste of a memory capacity.

FIG. 14 shows a part of the consolidated reference table for EFM and 8/16 demodulation. More particularly, there is shown decimal values of address bits of 11 bits long, decimal values of the corresponding 8 data bits, and assignment information indicating whether each pair of these bits is assigned to EFM modulated CD or 8/16 modulated DVD. The reference table of FIG. 14 has been verified to be precise for all patterns of channel bits modulated in accordance with EFM and 8/16 modulation schemes. At block 102 of FIG. 6, the address patterns of said consolidated reference table are collated with the patterns of address bits generated at block 115 or 124 to output the patterns of data bits and, then, the demodulation processing is terminated.

Figure 15:
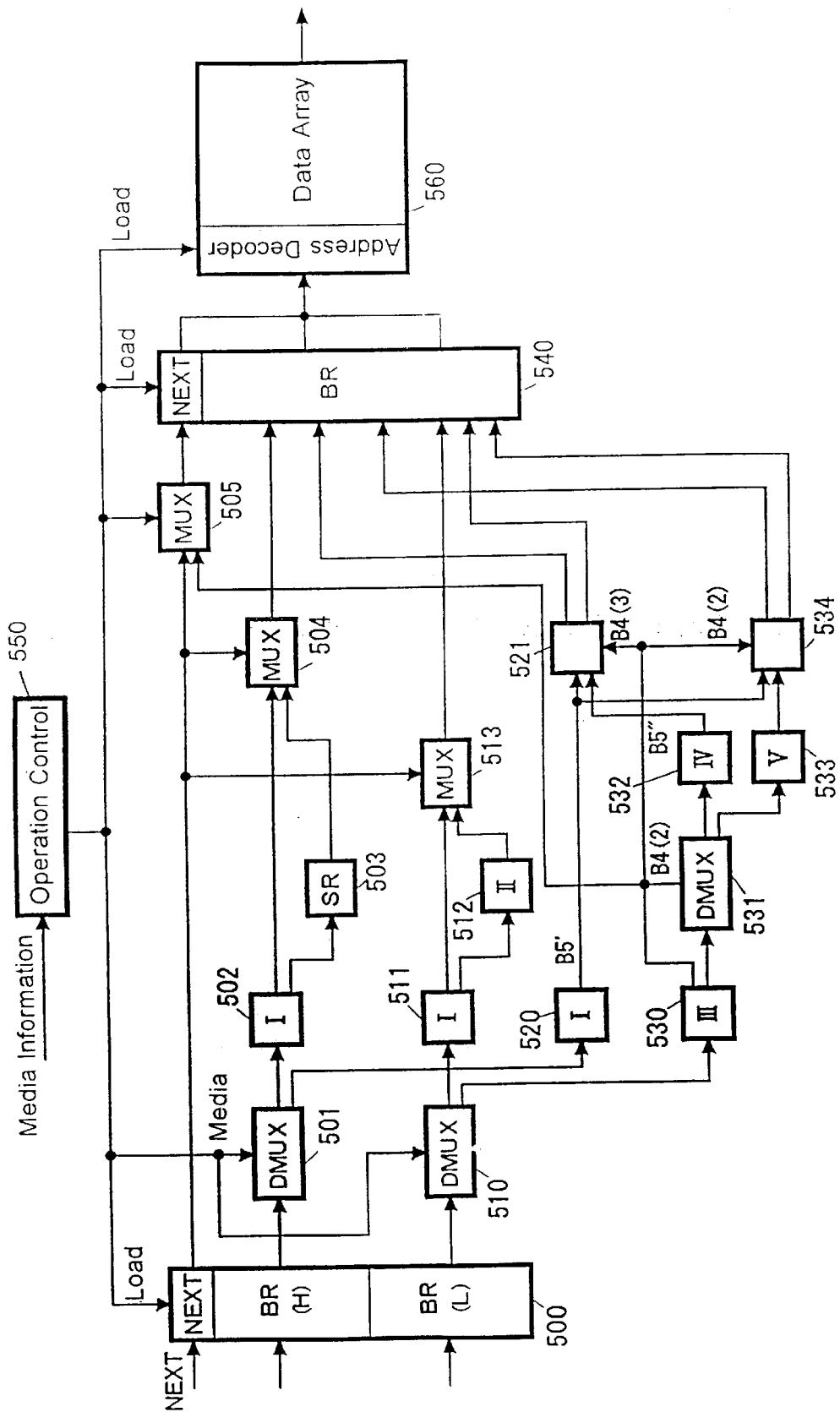
FIG. 15 is a diagram showing an embodiment of bit operation and memory circuitry in accordance with this invention.

FIG. 15 shows an embodiment of circuitry for demodulating channel bits. This demodulator comprises buffer registers 500 and 540, demultiplexers 501, 510 and 531, multiplexers 504, 505 and 513, 8/16 bit operation I circuits 502 and 511, a bit operation II circuit 512, an EFM bit operation I circuit 520, a bit operation III circuit 530, a bit operation IV circuit 532, a bit operation V circuit 533, a shift register 503, bit setting circuits 521 and 534, an operational control circuit 550 and a ROM 560, each being connected as shown.

Now, each of the components will be described below. Note here that block numbers in parentheses below denote functions executed by respective components, and they correspond to block numbers shown in FIG. 8 or FIG. 12. Buffer register 500 receives channel bits of 16 or 14 bits long modulated in accordance with 8/16 or EFM modulation scheme at its data input via an input line, and separately stores the upper 8 channel bits and the lower 8 or 6 channel bits at its upper and lower sections respectively under the control of a load signal from operational control circuit 550 (blocks 200, 300). In addition, a single NEXT flag bit is stored therein. Then, the upper 8-bit data stored in buffer register 500 is sent to demultiplexer 501. This demultiplexer 501 receives media information from operational control circuit 550 for selectively sending the upper 8-bit data to either 8/16 bit operation I circuit 502 or EFM bit operation I circuit 520 depending on whether the media information indicates that the involved medium is DVD or CD. On the other hand, the lower 8-bit or 6-bit data stored in buffer register 500 is sent to demultiplexer 510. Similarly to the above, this demultiplexer 510 is responsive to the media information from operational control circuit 550 for sending the lower 8-bit data to 8/16 bit operation I circuit 511 or for sending the lower 6-bit data to bit operation III circuit 530 depending on whether the media information indicates that the involved medium is DVD or CD.

Bit operation I circuit 502 performs the bit operations I on the upper 8-bit data (block 201) for converting the same to 5-bit data. Shift register 503 performs bit shifting of a data bus (block 206), whereas multiplexer 504 sends the 5-bit data, having been selectively shifted depending on a value of the NEXT flag bit, to buffer register 540 (blocks 210 thru 212). 8/16 bit operation I circuit 511 performs the bit operations I on the upper 8-bit data (block 202) for converting the same to 5-bit data. Bit operation II circuit 512 performs the bit operations II on the 5-bit data (block 207) for converting the same to 4-bit data. Multiplexer 513 is responsive to a value of the NEXT flag bit for selectively sending either the 5-bit data or 4-bit data to buffer register 540 (blocks 210 thru 212).

EFM bit operation I circuit 520 performs the bit operations I on the upper 8-bit data (block 301) for converting the same to 5-bit data. Bit operation III circuit 530 performs the bit operations III on the lower 6-bit data (block 302) for converting the same to 4-bit data. Demultiplexer 531 is responsive to a value of 3rd bit B4(2) of the converted data from bit operation III circuit 530 for selectively sending the converted data to either bit operation IV circuit 532 or bit operation V circuit 533 (block 303). Bit operation IV circuit 532 converts 3-bit data, excluding 3rd bit B4(2), to 5-bit data (block 304). Bit operation V circuit 533 converts 3-bit data, excluding 3rd bit B4(2), to 4-bit data (block 305).

Bit setting circuit 521 is responsive to a value of 4th bit B4(3) for concatenating the 5-bit data outputted from bit operation I circuit 520 to the 5-bit data outputted from bit operation IV circuit 532, thereby sending the resultant 10-bit data to buffer register 540 (blocks 306 thru 310). On the other hand, bit setting circuit 534 is responsive to a value of 3rd bit B4(2) for concatenating the 5-bit data outputted from bit operation I circuit 520 to the 4-bit data outputted from bit operation V circuit 533, performing bit shifting, and sending the resultant 9-bit data to buffer register 540 (blocks 311, 312). Each of the bit operation circuits may be implemented by wired logic circuitry rather than a stored program processor, which enables high-speed processing.

Within a data array of ROM 560, there is stored the consolidated reference table for EFM and 8/16 demodulation that has been already described in connection with block 102 of FIG. 6. When the output of buffer register 540 and a read-out control signal from operational control circuit 550 are concurrently applied to an address decoder of ROM 560, it is caused to output data that corresponds to the channel bits entered into buffer register 500.

Figure 16:
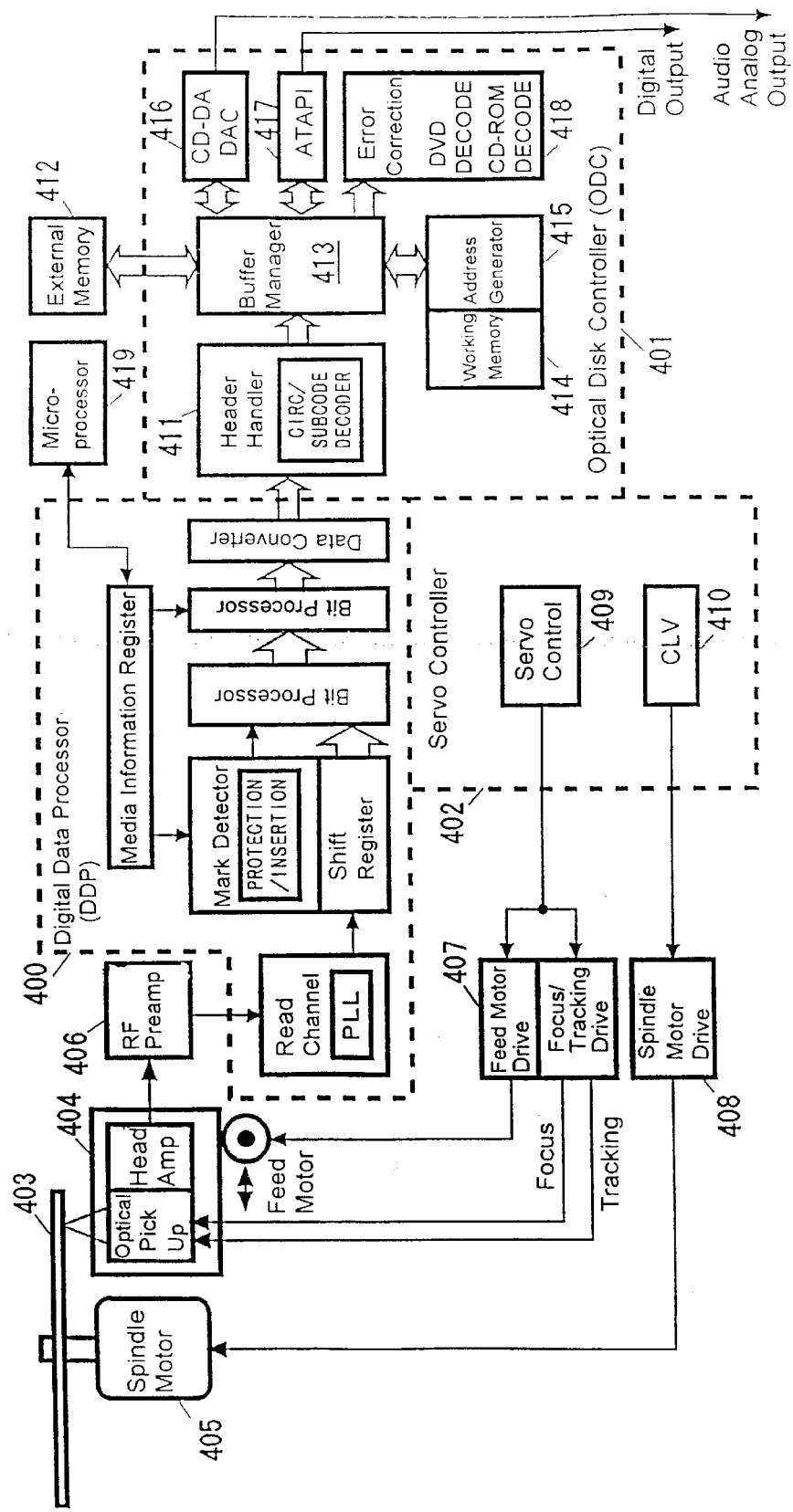
FIG. 16 is a schematic block diagram showing an optical disk playback apparatus in accordance with the present embodiment.

FIG. 16 is a schematic block diagram showing an optical disk playback apparatus, which incorporates demodulation circuitry in accordance with the present embodiment. A digital data processor 400 comprising a single LSI implements the same function as the demodulator as set forth above with reference to FIG. 5 and, thus, no further explanation thereof is given herein.

First, a signal detection subsystem will be described. An optical disk 403, which is a member of the CD or DVD family, records EFM or 8/16 modulated signals thereon. An actuator 404 is provided with an optical pickup and a head amplifier for reading information from a given position on optical disk 403. The head amplifier amplifies RF analog signals 406, and sends them to digital data processor 400.

Next, a servo control subsystem will be described. A servo control 409 is responsive to an instruction from a microprocessor 419 for sending a control signal to an actuator driver 407, thereby causing an actuator 404 to be moved to a desired position on optical disk 403 where information to be read is recorded. Further, servo control 409 sends a control signal for focusing the optical pickup on optical disk 403. Actuator driver 407 is provided with a feed motor driver and a focusing/tracking driver for driving a feed motor and an optical pickup driving mechanism (not shown) respectively. A revolution control 410 is responsive to an instruction from microprocessor 419 for sending a control signal to a spindle motor driver 408, whereby a velocity of optical disk 403 is changed depending on a radial position of actuator 404 to maintain a length of an accessed track per unit time at a constant value, no matter which track is being accessed by actuator 404. In response to such a control signal, spindle motor driver 408 drives a spindle motor 405 in an appropriate manner.

Next, a subsystem at the downstream side of digital data processor 400 will be described. A header handler 411 identifies a sector ID in the demodulated data from digital data processor 400, and sends information of a sector designated by microprocessor 419 to a next stage. Also, when optical disk 403 under demodulation is CD-DA, header handler 411 reads information of users bits for its signal processing and further performs error correction processing of signals. The data so processed by header handler 411 is temporarily stored into an external memory 412 via a buffer manager 413. When optical disk 403 under demodulation is CD or DVD other than CD-DA, an error correction processor 418 performs error correction processing on the data stored in external memory 412, and updates the stored content of external memory 412. A working memory 414 and an address generator 415 are used for the error correction processing of the data stored into external memory 412. Upon completion of the error correction processing, buffer manager 413 outputs analog data of CD-DA to an external device via a digital/analog converter 416. On the other hand, digital data of CD and DVD other than CD-DA is output to an external device via an interface 417.

As described above, in accordance with this invention, there has been provided a technique for converting a number of bits of channel bits modulated by first and second modulation schemes into a lesser number of bits for use in processing regenerated signals.

Also, in accordance with this invention, there has been provided a demodulating reference table, which is formed by consolidating respective reference tables used for demodulating channel bits modulated by first and second modulation schemes, and which is storable in a small capacity memory.

Further, in accordance with this invention, there has been provided a technique for demodulating channel bits that makes use of said converting technique and said demodulating reference table.

Moreover, in accordance with this invention, there has been provided an optical disk playback apparatus characterized by circuitry for demodulating regenerated signals.

We claim:

1. A method of converting first and second channel bits, modulated by first and second modulation schemes complying with first and second RLL constraints, to first and second output bits respectively, comprising the steps of:
   (a) identifying a modulation scheme of said first or second channel bits;
   (b) if said first channel bits are identified in said identifying step (a), then generating said first output bits for representing patterns that correspond to a plurality of patterns represented by said first channel bits other than those patterns being unable to exist under said first RLL constraints, said first output bits having a lesser number of bits than said first channel bits; and
   (c) if said second channel bits are identified in said identifying step (a), then generating said second output bits for representing patterns that correspond to a plurality of patterns represented by said second channel bits other than those patterns being unable to exist under said second RLL constraints, said patterns represented by said second output bits being located at discontinuous areas of said patterns represented by said first output bits, said second output bits having a lesser number of bits than said second channel bits.

2. The method as set forth in claim 1, wherein said first modulation scheme is an 8/16 modulation scheme, and said second modulation scheme is an EFM modulation scheme.

3. An apparatus for converting first and second channel bits, modulated by first and second modulation schemes complying with first and second RLL constraints, to first and second output bits respectively, comprising:
   (a) means for identifying a modulation scheme used in said first or second channel bits;
   (b) means responsive to an output of said identifying means for generating said first output bits for representing patterns that correspond to a plurality of patterns represented by said first channel bits other than those patterns being unable to exist under said first RLL constraints, said first output bits having a lesser number of bits than said first channel bits; and
   (c) means responsive to an output of said identifying means for generating said second output bits for representing patterns that correspond to a plurality of patterns represented by said second channel bits other than those patterns being unable to exist under said second RLL constraints, said patterns represented by said second output bits being located at discontinuous areas of said patterns represented by said first output bits, said second output bits having a lesser number of bits than said second channel bits.

4. The apparatus as set forth in claim 3, wherein said first modulation scheme is an 8/16 modulation scheme, and said second modulation scheme is an EFM modulation scheme.

5. A method of demodulating patterns of first and second channel bits, modulated by first and second modulation schemes complying with first and second RLL constraints, to patterns of data bits respectively, comprising the steps of:
   (a) identifying a modulation scheme used for said first or second channel bits;
   (b) if said first channel bits are identified in said identifying step (a), then generating first output bits for representing patterns that correspond to a plurality of patterns represented by said first channel bits other than those patterns being unable to exist under said first RLL constraints, said first output bits having a lesser number of bits than said first channel bits;
   (c) if said second channel bits are identified in said identifying step (a), then generating second output bits for representing patterns that correspond to a plurality of patterns represented by said second channel bits other than those patterns being unable to exist under said second RLL constraints, said patterns represented by said second output bits being located at discontinuous areas of said patterns represented by said first output bits, said second output bits having a lesser number of bits than said second channel bits;
   (d) providing a demodulating reference table, the said table being created by:
      (d1) generating a plurality of first address patterns for representing a plurality of patterns that correspond to said plurality of patterns represented by said first channel bits other than those patterns being unable to exist under said first RLL constraints,
      (d2) generating a plurality of second address patterns for representing a plurality of patterns that correspond to said plurality of patterns represented by said second channel bits other than those patterns being unable to exist under said second RLL constraints, said patterns represented by said second address patterns being located at discontinuous areas of said plurality of first address patterns, and
      (d3) associating patterns of said data bits with said plurality of first and second address patterns respectively; and
   (e) referring to a first or second address pattern of said demodulating reference table by using said first or second output bits, for outputting a pattern of said data bits corresponding to said referenced first or second address pattern.

6. The method as set forth in claim 5, wherein said first modulation scheme is an 8/16 modulation scheme, and said second modulation scheme is an EFM modulation scheme.

7. An apparatus for demodulating patterns of first and second channel bits, modulated by first and second modulation schemes complying with first and second RLL constraints, to patterns of data bits respectively, comprising:
   (a) means for identifying a modulation scheme of said first or second channel bits;
   (b) means responsive to an output of said identifying means for generating first output bits for representing patterns that correspond to a plurality of patterns represented by said first channel bits other than those patterns being unable to exist under said first RLL constraints, said first output bits having a lesser number of bits than said first channel bits;
   (c) means responsive to an output of said identifying means for generating second output bits for representing patterns that correspond to a plurality of patterns represented by said second channel bits other than those patterns being unable to exist under said second RLL constraints, said patterns represented by said second output bits being located at discontinuous areas of said patterns represented by said first output bits, said second output bits having a lesser number of bits than said second channel bits;

(d) means for providing a demodulating reference table, the said table being created by:
- (d1) generating a plurality of first address patterns for representing a plurality of patterns that correspond to said plurality of patterns represented by said first channel bits other than those patterns being unable to exist under said first RLL constraints,
- (d2) generating a plurality of second address patterns for representing a plurality of patterns that correspond to said plurality of patterns represented by said second channel bits other than those patterns being unable to exist under said second RLL constraints, said patterns represented by said second address patterns being located at discontinuous areas of said plurality of first address patterns, and
- (d3) associating patterns of said data bits with said plurality of first and second address patterns respectively; and (e) means for referring to a first or second address pattern of said demodulating reference table by using said first or second output bits, for outputting a pattern of said data bits corresponding to said referenced first or second address pattern.

8. The apparatus as set forth in claim 7, wherein said first modulation scheme is an 8/16 modulation scheme, and said second modulation scheme is an EFM modulation scheme.

9. An optical disk playback apparatus comprising an optical head for detecting a regenerated signal from an optical disk, a servo controller for controlling a revolution velocity of said optical disk together with a position and a focus of said optical head, demodulator and an error correction processor, characterized in that:

said demodulator comprises the apparatus as set forth in claim 7.

* * * * *